United States Patent
Zhao et al.

(10) Patent No.: US 11,152,500 B2
(45) Date of Patent: Oct. 19, 2021

(54) TUNNELING FIELD-EFFECT TRANSISTOR AND METHOD FOR MANUFACTURING TUNNELING FIELD-EFFECT TRANSISTOR

(71) Applicant: Huawei Technologies Co., Ltd., Guangdong (CN)

(72) Inventors: Jing Zhao, Dongguan (CN); Chen-Xiong Zhang, Plano, TX (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 26 days.

(21) Appl. No.: 16/232,841

(22) Filed: Dec. 26, 2018

(65) Prior Publication Data
US 2019/0148534 A1  May 16, 2019

Related U.S. Application Data

(63) Continuation of application No. PCT/CN2016/088035, filed on Jun. 30, 2016.

(51) Int. Cl.
*H01L 29/78* (2006.01)
*B82Y 10/00* (2011.01)
(Continued)

(52) U.S. Cl.
CPC .......... *H01L 29/78* (2013.01); *B82Y 10/00* (2013.01); *H01L 21/3086* (2013.01); *H01L 27/06* (2013.01); *H01L 29/0657* (2013.01); *H01L 29/0847* (2013.01); *H01L 29/1033* (2013.01); *H01L 29/42312* (2013.01);
(Continued)

(58) Field of Classification Search
None
See application file for complete search history.

(56) References Cited

U.S. PATENT DOCUMENTS 9,230,985 B1   1/2016  Wu et al.
10,600,881 B2 *  3/2020  Yang ............... H01L 29/66742
(Continued)

FOREIGN PATENT DOCUMENTS

CN   1407624 A    4/2003
CN   1855495 A   11/2006
(Continued)

OTHER PUBLICATIONS

Zhi Jiang, Zhi, "Drive Current Enhancement in TFET by Dual Source Region", Jan. 9, 2015, Journal of Electrical and Computer Engineering, vol. 2015, Article ID 905718, 11 pages (Year: 2015).*
(Continued)

*Primary Examiner* — Steven M Christopher
(74) *Attorney, Agent, or Firm* — Conley Rose, P.C.

(57) ABSTRACT

The application discloses a tunneling field-effect transistor, including: a substrate layer; a rectangular semiconductor strip formed on an upper surface of the substrate layer, where the rectangular semiconductor strip includes a first source region, a first channel region, a drain region, a second channel region, and a second source region that are disposed in sequence along a first direction; a first gate dielectric layer covering an outer surface of a first part of the first source region and a second gate dielectric layer covering an outer surface of a third part of the second source region.

17 Claims, 12 Drawing Sheets

(51) Int. Cl.
  *H01L 29/06* (2006.01)
  *H01L 29/423* (2006.01)
  *H01L 27/06* (2006.01)
  *H01L 29/739* (2006.01)
  *H01L 29/66* (2006.01)
  *H01L 21/308* (2006.01)
  *H01L 29/08* (2006.01)
  *H01L 29/10* (2006.01)

(52) U.S. Cl.
  CPC .. *H01L 29/66356* (2013.01); *H01L 29/66484* (2013.01); *H01L 29/66977* (2013.01); *H01L 29/7391* (2013.01)

(56) References Cited

U.S. PATENT DOCUMENTS

2013/0021061 A1   1/2013   Bjoerk et al.
2014/0042386 A1*  2/2014   Cea ................... H01L 29/42392
                                                              257/9
2016/0043220 A1*  2/2016   Huang ................. H01L 29/08
                                                              257/9

FOREIGN PATENT DOCUMENTS

| CN | 1917177 A   | 2/2007  |
| CN | 103151390 A | 6/2013  |
| CN | 103579324 A | 2/2014  |
| CN | 103688362 A | 3/2014  |
| CN | 104183487 A | 12/2014 |
| EP | 1901354 A1  | 3/2008  |
| EP | 2528099 A1  | 11/2012 |
| KR | 101286704 B1 | 7/2013 |

OTHER PUBLICATIONS

Alvaro Padilla et al, "Feedback FET: A Novel Transistor Exhibiting Steep Switching Behavior at Low Bias Voltages," 2008 IEEE International Electron Devices Meeting, Feb. 27, 2009, 4 pages.

* cited by examiner

TUNNELING FIELD-EFFECT TRANSISTOR AND METHOD FOR MANUFACTURING TUNNELING FIELD-EFFECT TRANSISTOR

CROSS-REFERENCE TO RELATED APPLICATIONS

This application is a continuation of International Application No. PCT/CN2016/088035, filed on Jun. 30, 2016, the disclosure of which is hereby incorporated by reference in its entirety.

TECHNICAL FIELD

The present application relates to the field of semiconductor technologies, and in particular, to a tunneling field-effect transistor and a method for manufacturing a tunneling field-effect transistor.

BACKGROUND

With continuous development of semiconductor technologies, a size of a MOSFET (Metal Oxide Semiconductor Field Effect Transistor) continuously decreases according to Moore's Law. However, in room temperature, limited by the Boltzmann distribution of carriers, a subthreshold swing SS of the MOSFET cannot decrease as the size of the component decreases and is always greater than 60 mV/decade. In this case, in a condition of a small-size component, power consumption of the MOSFET is relatively high. To meet semiconductor development requirements for high density, high performance, and low costs, a tunneling field-effect transistor (TFET for short) emerges.

The tunneling field-effect transistor is a P-doped-intrinsic-doped-N-doped diode (P-I-N diode for short) controlled by a gate. A doping type of a source region of the tunneling field-effect transistor is opposite to that of a drain region of the tunneling field-effect transistor. Therefore, the tunneling field-effect transistor has a carrier quantum tunneling mechanism, and band-to-band tunneling between carriers in the source region and carriers in a channel can be implemented. Having a working mechanism different from that of the MOSFET, in room temperature, the tunneling field-effect transistor is not limited by the Boltzmann distribution of carriers, and a subthreshold swing SS of the tunneling field-effect transistor may be less than 60 mV/decade. Therefore, under a relatively low voltage, the tunneling field-effect transistor may have relatively low power consumption.

However, because the tunneling field-effect transistor has a relatively large tunneling barrier resistance, a tunneling current of the tunneling field-effect transistor is relatively small.

SUMMARY

To resolve the problem in the prior art, embodiments of the present application provide a tunneling field-effect transistor and a method for manufacturing a tunneling field-effect transistor. The technical solutions are as follows:

According to a first aspect, a tunneling field-effect transistor is provided, and the tunneling field-effect transistor includes:

a substrate layer;

a rectangular semiconductor strip formed on an upper surface of the substrate layer, where the rectangular semiconductor strip includes a first source region, a first channel region, a drain region, a second channel region, and a second source region that are disposed in sequence along a first direction, the first direction is parallel to a length direction of the rectangular semiconductor strip, the first source region is disposed at one end of the rectangular semiconductor strip, the first channel region is close to the first source region, the drain region is disposed at a middle portion of the rectangular semiconductor, the second channel region is close to the drain region, the second source region is disposed at the other end of the rectangular semiconductor strip, the first source region is divided into a first part and a second part, the first part is close to the first channel region, the second source region is divided into a third part and a fourth part, and the third part is close to the second channel region;

a first gate dielectric layer covering an outer surface of the first part;

a second gate dielectric layer covering an outer surface of the third part;

a first gate region covering a top end, a first side surface, and a second side surface of the first gate dielectric layer, where the first side surface and the second side surface are two outer surfaces in the first gate dielectric layer that are parallel and opposite to a plane formed by the first direction and the second direction, a direction of an electric field applied in the first gate region points to the first source region, and the second direction is parallel to a height direction of the rectangular semiconductor; and a second gate region covering a top end, a third side surface, and a fourth side surface of the second gate dielectric layer, where the third side surface and the fourth side surface are two outer surfaces in the second gate dielectric layer that are parallel and opposite to the plane formed by the first direction and the second direction, and a direction of an electric field applied in the second gate region points to the second source region.

With reference to the first aspect, in a first possible implementation of the first aspect, the first gate region includes a first gate, a second gate, and a third gate;

the third gate covers the top end of the first gate dielectric layer, the first gate covers the first side surface of the first gate dielectric layer and a first outer surface of the third gate along the second direction, the second gate covers the second side surface of the first gate dielectric layer and a second outer surface of the third gate along the second direction, and the first outer surface and the second outer surface are two outer surfaces in the third gate that are parallel and opposite to the plane formed by the first direction and the second direction;

the second gate region includes a fourth gate, a fifth gate, and a sixth gate; and the sixth gate covers the top end of the second gate dielectric layer, the fourth gate covers the third side surface of the second gate dielectric layer and a third outer surface of the sixth gate, the fifth gate covers the fourth side surface of the second gate dielectric layer and a fourth outer surface of the sixth gate along the second direction, and the third outer surface and the fourth outer surface are two outer surfaces in the sixth gate that are parallel and opposite to the plane formed by the first direction and the second direction.

With reference to the first possible implementation of the first aspect, in a second possible implementation of the first aspect, the tunneling field-effect transistor further includes an epitaxial layer covering a specified region of the rectangular semiconductor strip, and the specified region includes a region from the first part to the third part of the rectangular semiconductor strip;

the epitaxial layer includes a first epitaxial layer, a second epitaxial layer, and a third epitaxial layer, the first epitaxial layer covers the outer surface of the first part, the first epitaxial layer is located between the first part and the first gate dielectric layer, the second epitaxial layer covers the outer surface of the third part, the second epitaxial layer is located between the third part and the second gate dielectric layer, and the third epitaxial layer covers an outer surface of the rectangular semiconductor strip between the first part and the third part, where the first epitaxial layer and the first part form a first tunneling junction, and the second epitaxial layer and the third part form a second tunneling junction.

With reference to the second possible implementation of the first aspect, in a third possible implementation of the first aspect, the tunneling field-effect transistor further includes: the tunneling field-effect transistor further includes a first isolating layer disposed between the first gate dielectric layer and the third gate; and a second isolating layer disposed between the second gate dielectric layer and the sixth gate.

With reference to the first aspect, in a fourth possible implementation of the first aspect, the tunneling field-effect transistor includes an N-type tunneling field-effect transistor and a P-type tunneling field-effect transistor.

With reference to the fourth possible implementation of the first aspect, in a fifth possible implementation of the first aspect, when the tunneling field-effect transistor is an N-type tunneling field-effect transistor, the first source region and the second source region are heavily P-doped regions on the rectangular semiconductor strip, and the drain region is a heavily N-doped region on the rectangular semiconductor strip; or when the tunneling field-effect transistor is a P-type tunneling field-effect transistor, the first source region and the second source region are heavily N-doped regions on the rectangular semiconductor strip, and the drain region is a heavily P-doped region on the rectangular semiconductor strip.

According to a second aspect, a method for manufacturing a tunneling field-effect transistor is provided, and the method includes:

providing a substrate layer;

forming a rectangular semiconductor strip on the substrate layer;

forming a first source region and a second source region on the rectangular semiconductor strip, where the first source region and the second source region are disposed at two ends of the rectangular semiconductor strip along a first direction, and the first direction is parallel to a length direction of the rectangular semiconductor strip;

forming a drain region on the rectangular semiconductor strip on which the first source region and the second source region are formed, where a first channel region is formed between the first source region and the drain region, a second channel region is formed between the second source region and the drain region, the first source region includes a first part and a second part, the first part is close to the first channel region, the second source region includes a third part and a fourth part, and the third part is close to the second channel region; and forming a first gate dielectric layer and a first gate region in sequence on the first part of the rectangular semiconductor strip on which the drain region is formed, and forming a second gate dielectric layer and a second gate region in sequence on the third part.

With reference to the second aspect, in a first possible implementation of the second aspect, the forming a rectangular semiconductor strip on the substrate layer includes:

depositing a semiconductor layer on the substrate layer;

depositing a first hard mask layer on the semiconductor layer;

depositing a first photoresist layer on the first hard mask layer;

etching two side parts of the first photoresist layer and the first hard mask layer in the first direction;

etching the semiconductor layer to a surface of the substrate layer by using a remaining first photoresist layer and first hard mask layer as a mask; and removing the remaining first photoresist layer and first hard mask layer to form the rectangular semiconductor strip.

With reference to the second aspect, in a second possible implementation of the second aspect, the forming a rectangular semiconductor strip on the substrate layer includes:

depositing a first hard mask layer on the substrate layer;

depositing a first photoresist layer on the first hard mask layer;

etching a middle part of the first photoresist layer in the first direction to expose a middle part of the first hard mask layer in the first direction;

etching the middle part of the first hard mask layer in the first direction to a surface of the substrate layer;

depositing a semiconductor layer by using a remaining first photoresist layer as a mask;

etching the semiconductor layer that is deposited on an upper surface of the remaining first photoresist layer and the remaining first photoresist layer;

depositing a second hard mask layer on the substrate layer;

etching two side parts of the second hard mask layer in the first direction to expose two side parts of the first hard mask layer in the first direction;

etching the two side parts of the first hard mask layer in the first direction by using a remaining second hard mask layer as a mask; and removing the remaining second hard mask layer to form the rectangular semiconductor strip.

With reference to the second aspect, in a third possible implementation of the second aspect, the forming a first source region and a second source region on the rectangular semiconductor strip includes:

depositing a third hard mask layer and a second photoresist layer in sequence at two sides of the rectangular semiconductor strip along a second direction, where the second direction is parallel to a height direction of the rectangular semiconductor strip;

etching two side parts of the second photoresist layer and the third hard mask layer in the second direction, and reserving middle parts of the second photoresist layer and the third hard mask layer in the second direction;

injecting first-type doping ions into the two side parts of the rectangular semiconductor strip in the second direction by using a remaining second photoresist layer and third hard mask layer as a mask; and removing the remaining second photoresist layer and third hard mask layer to form the first source region and the second source region.

With reference to the second aspect, in a fourth possible implementation of the second aspect, the forming a drain region on the rectangular semiconductor strip on which the first source region and the second source region are formed includes:

depositing a fourth hard mask layer and a third photoresist layer in sequence along a second direction at the two sides of the rectangular semiconductor strip on which the first source region and the second source region are formed, where the second direction is parallel to a height direction of the rectangular semiconductor strip;

etching middle parts of the third photoresist layer and the fourth hard mask layer in the second direction, and reserving two side parts of the third photoresist layer and the fourth hard mask layer in the second direction;

injecting, by using a remaining third photoresist layer and fourth hard mask layer as a mask, second-type doping ions into a middle portion of the rectangular semiconductor strip on which the first source region and the second source region are formed; and removing the remaining third photoresist layer and fourth hard mask layer to form the drain region.

With reference to any one of the first possible implementation of the second aspect to the fourth possible implementation of the second aspect, in a fifth possible implementation of the second aspect, materials of the first hard mask layer, the second hard mask layer, the third hard mask layer, and the fourth hard mask layer include one of a silicon oxide material, silicon nitride, and silicon oxynitride.

With reference to the second aspect, in a sixth possible implementation of the second aspect, the forming a first gate dielectric layer and a first gate region in sequence on the first part of the rectangular semiconductor strip on which the drain region is formed, and forming a second gate dielectric layer and a second gate region in sequence on the third part includes:

depositing a gate dielectric layer on the rectangular semiconductor strip on which the drain region is formed;

depositing a gate layer on the gate dielectric layer; and etching the gate dielectric layer and the gate layer, to form the first gate dielectric layer and the first gate region in sequence on the first part and form the second gate dielectric layer and the second gate region in sequence on the third part, where the first gate region includes a first gate, a second gate, and a third gate, the first gate covers a first side surface of the first gate dielectric layer along a second direction, the second gate covers a second side surface of the first gate dielectric layer along the second direction, the third gate covers a top end of the first gate dielectric layer, the second direction is parallel to a height direction of the rectangular semiconductor, the first side surface and the second side surface are two opposite outer surfaces of the first gate dielectric layer; and the second gate region includes a fourth gate, a fifth gate, and a sixth gate, the fourth gate covers a third side surface of the second gate dielectric layer along the second direction, the fifth gate covers a fourth side surface of the second gate dielectric layer, the sixth gate covers a top end of the second gate dielectric layer, and the third side surface and the fourth side surface are two opposite outer surfaces of the second gate dielectric layer. With reference to the sixth possible implementation of the second aspect, in a seventh possible implementation of the second aspect, a material of the gate dielectric layer includes one of silicon dioxide and a high-k dielectric material.

With reference to the sixth possible implementation of the second aspect, in an eighth possible implementation of the second aspect, a material of the gate layer includes one of polycrystalline silicon and metal.

With reference to the sixth possible implementation of the second aspect, in a ninth possible implementation of the second aspect, before the forming a drain region on the rectangular semiconductor strip on which the first source region and the second source region are formed, the method further includes:

depositing an in-situ doped semiconductor layer on a specified region of the rectangular semiconductor strip on which the first source region and the second source region are formed, to form an epitaxial layer, where the specified region includes a region from the first part to the third part of the rectangular semiconductor strip, the epitaxial layer includes a first epitaxial layer, a second epitaxial layer, and a third epitaxial layer, the first epitaxial layer covers an upper surface of the first part, the first epitaxial layer is located between the first part and the first gate dielectric layer, the second epitaxial layer covers an upper surface of the third part, the second epitaxial layer is located between the third part and the second gate dielectric layer, the third epitaxial layer covers an upper surface of the rectangular semiconductor strip between the first part and the third part, the first epitaxial layer and the first part form a first tunneling junction, and the second epitaxial layer and the third part form a second tunneling junction.

With reference to the ninth possible implementation of the second aspect, in a tenth possible implementation of the second aspect, the method further includes:

before the depositing a gate layer on the gate dielectric layer, depositing an isolating layer at a top end of the gate dielectric layer; and etching the isolating layer in a process of etching the gate dielectric layer and the gate layer, to form a first isolating layer between the first gate dielectric layer and the third gate, and form a second isolating layer between the second gate dielectric layer and the sixth gate.

With reference to the second aspect, in an eleventh possible implementation of the second aspect, a material of the substrate layer includes one of silicon, germanium, silicon on insulator, germanium on insulator, and a group III-V compound.

With reference to any one of the second aspect to the eleventh possible implementation of the second aspect, in a twelfth possible implementation of the second aspect, after the forming a first gate dielectric layer and a first gate region in sequence on the first part of the rectangular semiconductor strip on which the drain region is formed, and forming a second gate dielectric layer and a second gate region in sequence on the third part, the method further includes:

depositing a side wall in the first gate region and the second gate region.

With reference to the twelfth possible implementation of the second aspect, in a thirteenth possible implementation of the second aspect, a material of the side wall includes silicon oxide, silicon nitride, a high-k dielectric, or another insulating material.

With reference to the thirteenth possible implementation of the second aspect, in a fourteenth possible implementation of the second aspect, after the depositing a side wall in the first gate region and the second gate region, the method further includes:

performing a contact process and a backend interconnection process on the substrate layer on which the side wall is deposited, to form an electrode connected structure.

With reference to the second aspect, in a fifteenth possible implementation of the second aspect, the tunneling field-effect transistor includes an N-type tunneling field-effect transistor and a P-type tunneling field-effect transistor.

With reference to the fifteenth possible implementation of the second aspect, in a sixteenth possible implementation of the second aspect, when the tunneling field-effect transistor is an N-type tunneling field-effect transistor, the first source region and the second source region are heavily P-doped regions on the rectangular semiconductor strip, and the drain region is a heavily N-doped region on the rectangular semiconductor strip; or when the tunneling field-effect transistor is a P-type tunneling field-effect transistor, the first source region and the second source region are heavily N-doped regions on the rectangular semiconductor strip, and the drain region is a heavily P-doped region on the rectangular semiconductor strip.

The technical solutions provided in the embodiments of the present application have the following beneficial effects:

A dual source region design is used, so that a tunneling area of carriers in a source region is increased; a direction of an electric field applied in a gate region is the same as a tunneling direction of carriers in the source region, so that a tunneling probability is increased; and because a tunneling current is in direct proportion to the tunneling area and the tunneling probability, the tunneling current is relatively large.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and persons of ordinary skill in the art may still derive other drawings from these accompanying drawings without creative efforts.

LIST OF REFERENCE NUMERALS

1: Substrate layer; 2: Rectangular doped semiconductor strip; 201: First source region; 2011: First part of first source region; 2012: Second part of first source region; 202: Second source region; 2021: Third part of second source region; 2022: Fourth part of second source region; 203: Drain region; 204: First channel region; 205: Second channel region; 301: First gate dielectric layer; 302: Second gate dielectric layer; 401: First gate region; 4011: First gate; 4012: Second gate; 4013: Third gate; 402: Second gate region; 4021: Fourth gate; 4022: Fifth gate; 4023: Sixth gate; 500: Epitaxial layer; 501: First epitaxial layer; 502: Second epitaxial layer; 503: Third epitaxial layer; 1201: First isolating layer; 1202: Second isolating layer.

DESCRIPTION OF EMBODIMENTS

To make the objectives, technical solutions, and advantages of the present application clearer, the following further describes the implementations of the present application in detail with reference to the accompanying drawings.

Figure 1:
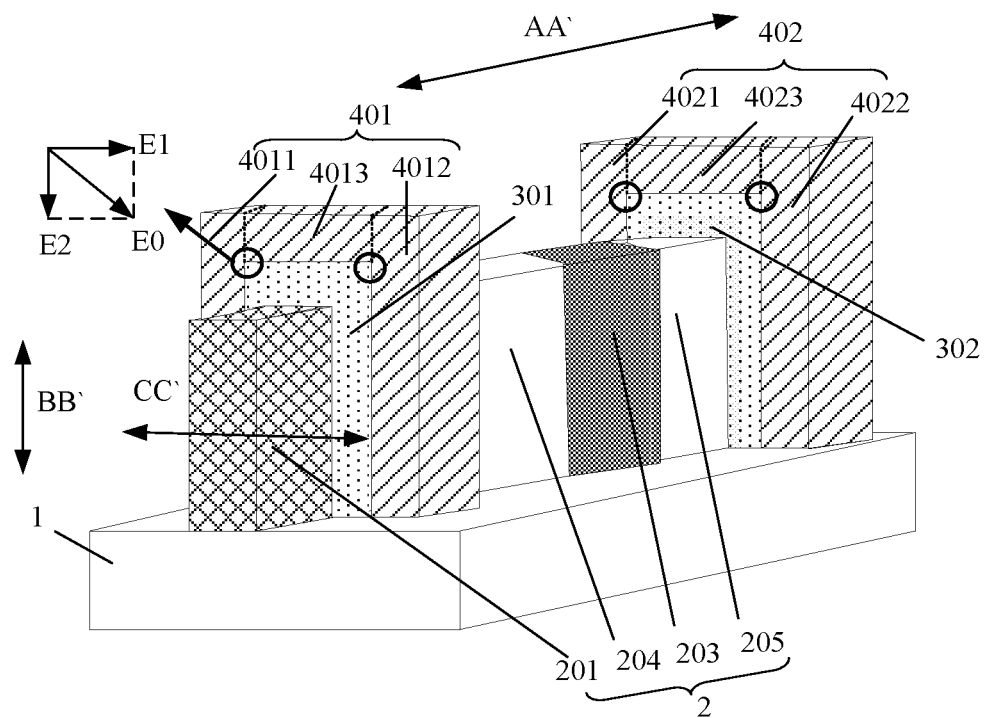
FIG. 1 is a schematic three-dimensional structural diagram of a tunneling field-effect transistor shown in an embodiment of the present application.
Figure 2:
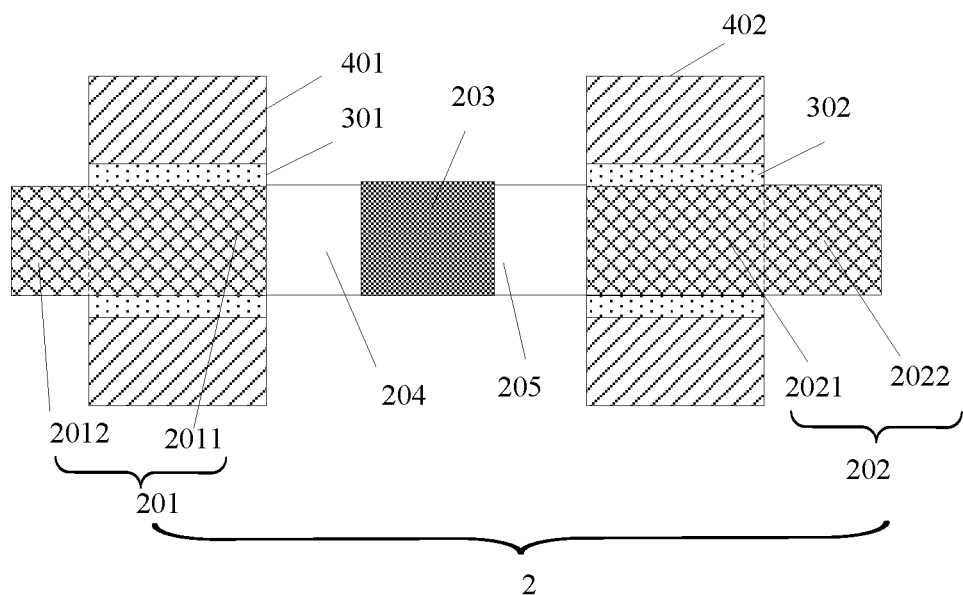
FIG. 2 is a cross-sectional view of a tunneling field-effect transistor according to another embodiment of the present application.

An embodiment of the present application provides a tunneling field-effect transistor, and the tunneling field-effect transistor is described in detail with reference to FIG. 1 and FIG. 2. FIG. 1 is a schematic three-dimensional structural diagram of the tunneling field-effect transistor. FIG. 2 is a cross-sectional view obtained by cutting the tunneling field-effect transistor shown in FIG. 1 along CC'. Referring to FIG. 1, the tunneling field-effect transistor includes: a substrate layer 1;

a rectangular semiconductor strip 2 formed on an upper surface of the substrate layer 1, where the rectangular semiconductor strip 2 includes a first source region 201, a first channel region 204, a drain region 203, a second channel region 205, and a second source region 202 that are disposed in sequence along a first direction, the first direction is parallel to a length direction of the rectangular semiconductor strip 2 and is a direction indicated by AA' in FIG. 1, the first source region 201 is disposed at one end of the rectangular semiconductor strip 2, the first channel region 204 is close to the first source region 201, the drain region 203 is disposed at a middle portion of the rectangular semiconductor 2, the second channel region 205 is close to the drain region 203, the second source region 202 (which is not shown in the figure because the second source region 202 is blocked by a second gate region 402) is disposed at the other end of the rectangular semiconductor strip 2, the first source region 201 is divided into a first part 2011 and a second part 2012, the first part 2011 is close to the first channel region 204, the second source region 202 is divided into a third part 2021 and a fourth part 2022, and the third part 2021 is close to the second channel region 205;

a first gate dielectric layer 301 covering an outer surface of the first part 2011 of the first source region;

a second gate dielectric layer 302 covering an outer surface of the third part 2021 of the second source region;

a first gate region 401 covering a top end, a first side surface, and a second side surface of the first gate dielectric layer 301, where the first side surface and the second side surface are two outer surfaces in the first gate dielectric layer 301 that are parallel and opposite to a plane formed by the first direction and a second direction, the second direction is parallel to a height direction of the rectangular semiconductor and is a direction indicated by BB' in the figure, and a direction of an electric field applied in the first gate region 401 points to the first source region 201; and a second gate region 402 covering a top end, a third side surface, and a fourth side surface of the second gate dielectric layer 302, where the third side surface and the fourth side surface are two outer surfaces in the second gate dielectric layer that are parallel and opposite to the plane formed by the first direction and the second direction, and a direction of an electric field applied in the second gate region 402 points to the second source region 202.

In another embodiment of the present application, referring to FIG. 1, based on a location relationship between the first gate region 401 and the top end of the first gate dielectric layer 301, the first gate region 401 may include a first gate 4011, a second gate 4012, and a third gate 4013. The third gate 4013 covers the top end of the first gate dielectric layer 301, the first gate 4011 covers the first side surface of the first gate dielectric layer 301 and a first outer surface of the third gate 4013 along the second direction, the second gate 4012 covers the second side surface of the first gate dielectric layer 301 and a second outer surface of the third gate 4013 along the second direction, and the first outer surface and the second outer surface are two outer surfaces in the third gate 4013 that are parallel and opposite to the plane formed by the first direction and the second direction.

In another embodiment of the present application, referring to FIG. 1, based on a location relationship between the second gate region 402 and the top end of the second gate dielectric layer 302, the second gate region 402 may include a fourth gate 4021, a fifth gate 4022, and a sixth gate 4023. The sixth gate 4023 covers the top end of the second gate dielectric layer 302, the fourth gate 4021 covers the third side surface of the second gate dielectric layer 302 and a third outer surface of the sixth gate 4023, the fifth gate 4022 covers the fourth side surface of the second gate dielectric layer 302 and a fourth outer surface of the sixth gate 4023 along the second direction, and the third outer surface and the fourth outer surface are two outer surfaces in the sixth gate 4023 that are parallel and opposite to the plane formed by the first direction and the second direction.

Figure 3A:
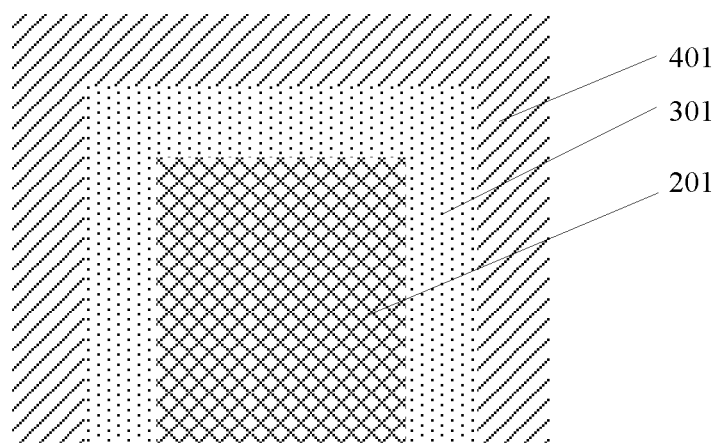
FIG. 3(A) is a left view of a tunneling field-effect transistor according to another embodiment of the present application.

FIG. 3(A) is a left view of the tunneling field-effect transistor shown in FIG. 1. It may be learned with reference to FIG. 2 and FIG. 3(A) that, the tunneling field-effect transistor includes the first source region 201, the first gate dielectric layer 301, and the first gate region 401 that are disposed in sequence from inside to outside. The first source region 201 is divided into the first part 2011 and the second part 2012, the first part 2011 is close to the first channel region 204, the first gate dielectric layer 301 surrounds the outer surface of the first part 2011, and the first gate region 401 surrounds an outer surface of the first gate dielectric layer 301.

Figure 3B:
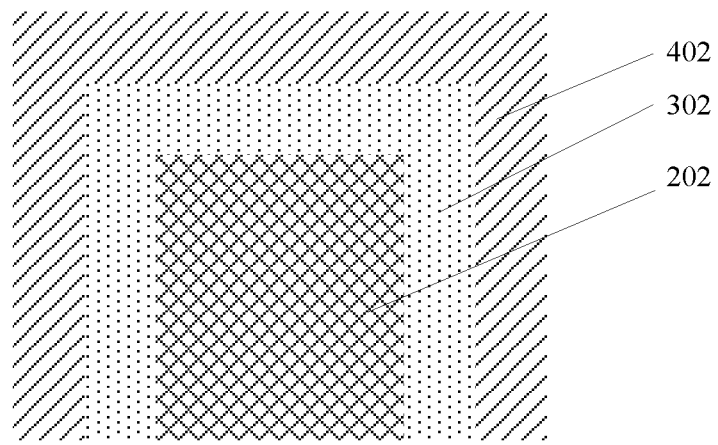
FIG. 3(B) is a right view of a tunneling field-effect transistor according to another embodiment of the present application.

FIG. 3(B) is a right view of the tunneling field-effect transistor shown in FIG. 1. It may be learned with reference to FIG. 2 and FIG. 3(B) that, the tunneling field-effect transistor includes the second source region 202, the second gate dielectric layer 302, and the second gate region 402 that are disposed in sequence from inside to outside. The second source region 202 is divided into the third part 2021 and the fourth part 2022, the third part 2022 is close to the second channel region 205, the second gate dielectric layer 302 surrounds the outer surface of the third part 2021, and the second gate region 402 surrounds an outer surface of the second gate dielectric layer 302.

In another embodiment of the present application, the tunneling field-effect transistor includes an N-type tunneling field-effect transistor and a P-type tunneling field-effect transistor. When the tunneling field-effect transistor is an N-type tunneling field-effect transistor, the first source region and the second source region are heavily P-doped regions on the rectangular semiconductor strip, and the drain region is a heavily N-doped region on the rectangular semiconductor strip; or when the tunneling field-effect transistor is a P-type tunneling field-effect transistor, the first source region and the second source region are heavily N-doped regions on the rectangular semiconductor strip, and the drain region is a heavily P-doped region on the rectangular semiconductor strip.

A working principle of the tunneling field-effect transistor shown in FIG. 1 is as follows: In a scenario in which a forward-bias voltage is applied in the first gate region 401 and the second gate region 402, the first source region 201 and the second source region 202 are grounded, and a forward-bias voltage is applied in the drain region 203, under the effect of the electric field in the first gate region 401, a few carriers in the first source region 201 tunnel from a valence band maximum to a conduction band minimum to form a tunneling current, and under the effect of an electric field in the drain region 203, the tunneling current flows into the drain region 203 to form a leakage current; and in addition, under the effect of the electric field in the second gate region 402, a few carriers in the second source region 202 also tunnel from a valence band maximum to a conduction band minimum to form a tunneling current, and under the effect of the electric field in the drain region 203, the tunneling current flows into the drain region 203 to form a leakage current. Because the tunneling field-effect transistor shown in FIG. 1 has two source regions, each source region is controlled by a plurality of gates, and a direction of an electric field of each gate is the same as a tunneling direction of carriers in the source region, a tunneling probability of the carriers is increased. Further, there is a combined electric field at a turning point indicated by a circle in FIG. 1 and the combined electric field increases intensity of a gate electric field, and therefore a tunneling probability of carriers at the turning point is increased. In the field of semiconductor technologies, a size of a tunneling current is in direct proportion to a tunneling area and a tunneling probability. Therefore, a tunneling current is greatly increased by using the tunneling field-effect transistor shown in FIG. 1.

In the tunneling field-effect transistor provided in the present application, a dual source region design is used, so that a tunneling area of carriers in a source region is increased; a direction of an electric field applied in a gate region is the same as a tunneling direction of carriers in the source region, so that a tunneling probability is increased; and because a tunneling current is in direct proportion to the tunneling area and the tunneling probability, the tunneling current is relatively large.

Figure 4:
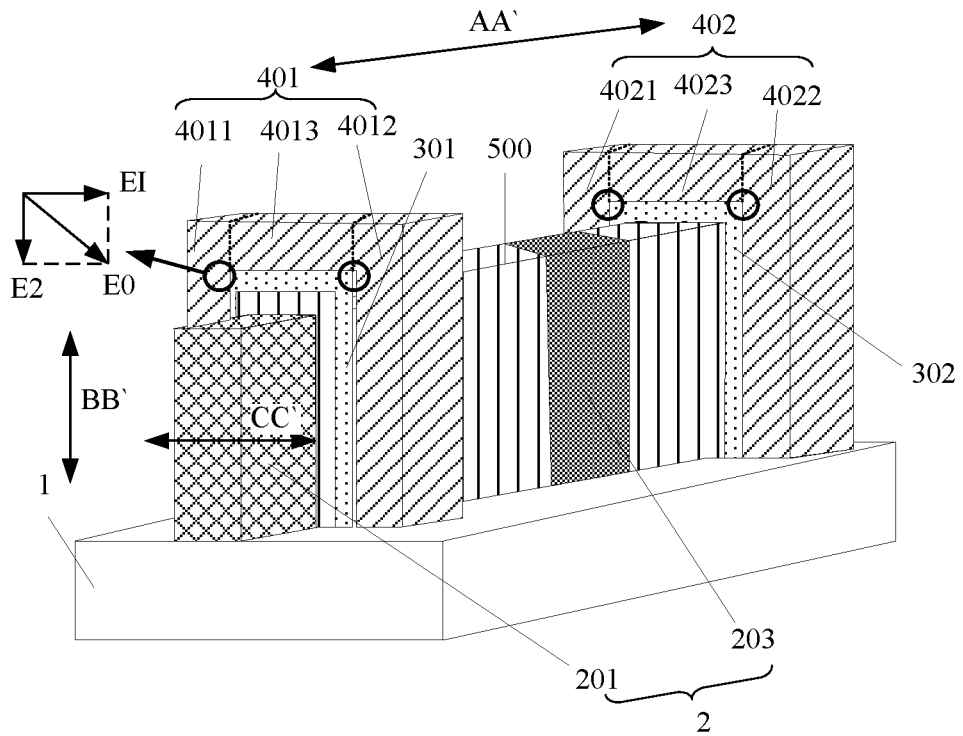
FIG. 4 is a schematic three-dimensional structural diagram of a tunneling field-effect transistor according to another embodiment of the present application.
Figure 5:
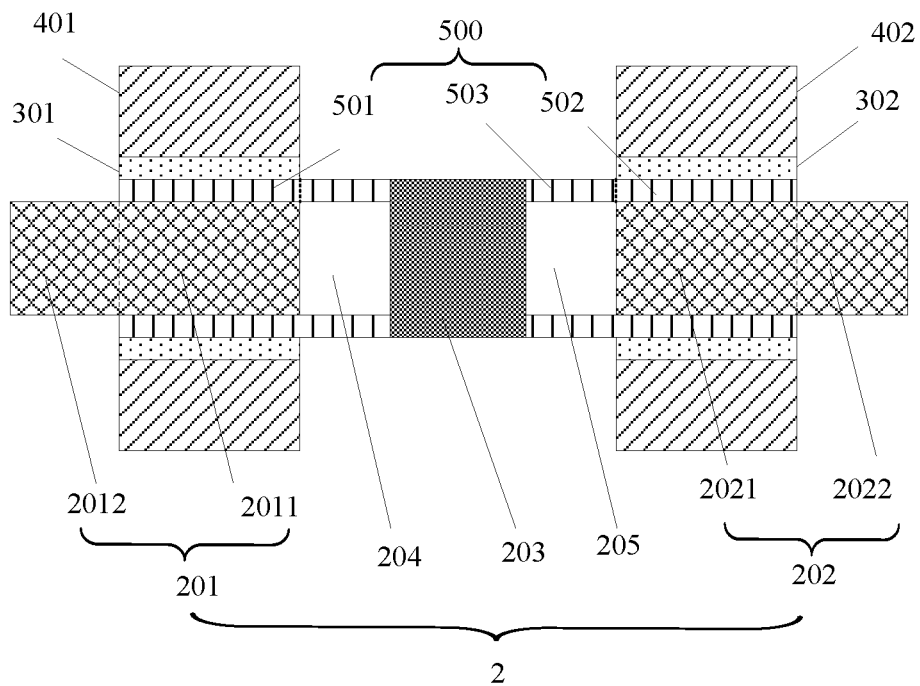
FIG. 5 is a cross-sectional view of a tunneling field-effect transistor according to another embodiment of the present application.

An embodiment of the present application provides a tunneling field-effect transistor, and the tunneling field-effect transistor is described in detail with reference to FIG. 4 and FIG. 5. FIG. 4 is a schematic three-dimensional structural diagram of the tunneling field-effect transistor. FIG. 5 is a cross-sectional view obtained by cutting the tunneling field-effect transistor shown in FIG. 4 along CC'. Referring to FIG. 4, the tunneling field-effect transistor includes: a substrate layer 1;

a rectangular semiconductor strip 2 formed on an upper surface of the substrate layer 1, where the rectangular semiconductor strip 2 includes a first source region 201, a first channel region 204, a drain region 203, a second channel region 205, and a second source region 202 that are disposed in sequence along a first direction, the first direction is parallel to a length direction of the rectangular semiconductor strip 2 and is a direction indicated by AA' in FIG. 4, the first source region 201 is disposed at one end of the rectangular semiconductor strip 2, the first channel region 204 is close to the first source region 201, the drain region 203 is disposed at a middle portion of the rectangular semiconductor 2, the second channel region 205 is close to the drain region 203, the second source region 202 (which is not shown in the figure because the second source region 202 is blocked by a second gate region 402) is disposed at the other end of the rectangular semiconductor strip 2, the first source region 201 is divided into a first part 2011 and a second part 2012, the first part 2011 is close to the first channel region 204, the second source region 202 is divided into a third part 2021 and a fourth part 2022, and the third part 2021 is close to the second channel region 205;

an epitaxial layer 500 covering a specified region of the rectangular semiconductor strip 2, where the specified region includes a region from the first part 2011 to the third part 2021 of the rectangular semiconductor strip; and the epitaxial layer 500 includes a first epitaxial layer 501, a second epitaxial layer 502, and a third epitaxial layer 503, a first epitaxial layer 501 covers an outer surface of the first part 2011, a first epitaxial layer 501 is located between the first part 2011 and the first gate dielectric layer 301, the second epitaxial layer 502 covers an outer surface of the third part 2021, the second epitaxial layer 502 is located between the third part 2021 and the second gate dielectric layer 302, and the third epitaxial layer 503 covers an outer surface of the rectangular semiconductor strip 2 between the first part 2011 and the third part 2021;

a first gate dielectric layer 301 covering an outer surface of the first epitaxial layer 501;

a second gate dielectric layer 302 covering an outer surface of the second epitaxial layer 502;

a first gate region 401 covering a top end, a first side surface, and a second side surface of the first gate dielectric layer 301, where the first side surface and the second side surface are two outer surfaces in the first gate dielectric layer 301 that are parallel and opposite to a plane formed by the first direction and a second direction, the second direction is parallel to a height direction of the rectangular semiconductor and is a direction indicated by BB' in the figure, and a direction of an electric field applied in the first gate region 401 points to the first source region 201; and a second gate region 402 covering a top end, a third side surface, and a fourth side surface of the second gate dielectric layer 302, where the third side surface and the fourth side surface are two outer surfaces in the second gate dielectric layer that are parallel and opposite to the plane formed by the first direction and the second direction, and a direction of an electric field applied in the second gate region 402 points to the second source region 202.

In another embodiment of the present application, referring to FIG. 5, based on a location relationship between the first gate region 401 and the top end of the first gate dielectric layer 301, the first gate region 401 may include a first gate 4011, a second gate 4012, and a third gate 4013. The third gate 4013 covers the top end of the first gate dielectric layer 301, the first gate 4011 covers the first side surface of the first gate dielectric layer 301 and a first outer surface of the third gate 4013 along the second direction, the second gate 4012 covers the second side surface of the first gate dielectric layer 301 and a second outer surface of the third gate 4013 along the second direction, and the first outer surface and the second outer surface are two outer surfaces in the third gate 4013 that are parallel and opposite to the plane formed by the first direction and the second direction.

In another embodiment of the present application, referring to FIG. 5, based on a location relationship between the second gate region 402 and the top end of the second gate dielectric layer 302, the second gate region 402 may include a fourth gate 4021, a fifth gate 4022, and a sixth gate 4023. The sixth gate 4023 covers the top end of the second gate dielectric layer 302, the fourth gate 4021 covers the third side surface of the second gate dielectric layer 302 and a third outer surface of the sixth gate 4023, the fifth gate 4022 covers the fourth side surface of the second gate dielectric layer 302 and a fourth outer surface of the sixth gate 4023 along the second direction, and the third outer surface and the fourth outer surface are two outer surfaces in the sixth gate 4023 that are parallel and opposite to the plane formed by the first direction and the second direction.

Figure 6A:
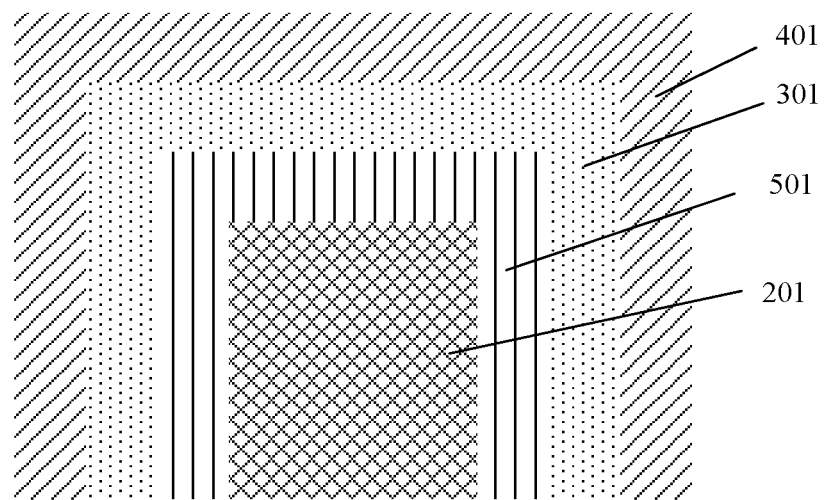
FIG. 6(A) is a left view of a tunneling field-effect transistor according to another embodiment of the present application.

FIG. 6(A) is a left view of the tunneling field-effect transistor shown in FIG. 4. It may be learned with reference to FIG. 5 and FIG. 6(A) that, the tunneling field-effect transistor includes the first source region 201, the first epitaxial layer 501, the first gate dielectric layer 301, and the first gate region 401 that are disposed in sequence from inside to outside. The first source region 201 is divided into the first part 2011 and the second part 2012, the first part 2011 is close to the first channel region 204, the first epitaxial layer 501 surrounds the outer surface of the first part 2011, the first gate dielectric layer 301 surrounds an outer surface of the first epitaxial layer 501, and the first gate region 401 surrounds an outer surface of the first gate dielectric layer 301.

Figure 6B:
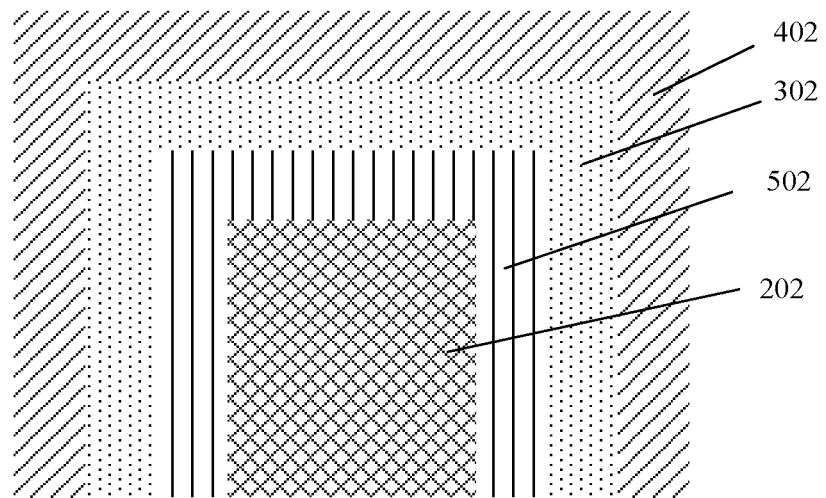
FIG. 6(B) is a right view of a tunneling field-effect transistor according to another embodiment of the present application.

FIG. 6(B) is a right view of the tunneling field-effect transistor shown in FIG. 4. It may be learned with reference to FIG. 5 and FIG. 6(B) that, the tunneling field-effect transistor includes the second source region 202, the second epitaxial layer 502, the second gate dielectric layer 302, and the second gate region 402 that are disposed in sequence from inside to outside. The second source region 202 is divided into the third part 2021 and the fourth part 2022, the third part 2021 is close to the second channel region 205, the second epitaxial layer 502 surrounds the outer surface of the third part 2021, the second gate dielectric layer 302 surrounds an outer surface of the second epitaxial layer 502, and the second gate region 402 surrounds an outer surface of the second gate dielectric layer 302.

In another embodiment of the present application, the tunneling field-effect transistor includes an N-type tunneling field-effect transistor and a P-type tunneling field-effect transistor. When the tunneling field-effect transistor is an N-type tunneling field-effect transistor, the first source region and the second source region are heavily P-doped regions on the semiconductor strip, and the drain region is a heavily N-doped region on the semiconductor strip; or when the tunneling field-effect transistor is a P-type tunneling field-effect transistor, the first source region and the second source region are heavily N-doped regions on the semiconductor strip, and the drain region is a heavily P-doped region on the semiconductor strip.

A working principle of the tunneling field-effect transistor shown in FIG. 4 is as follows: In a scenario in which a forward-bias voltage is applied in the first gate region 401 and the second gate region 402, the first source region 201 and the second source region 202 are grounded, and a forward-bias voltage is applied in the drain region 203, under the effect of the electric field in the first gate region 401, a few carriers in the first source region 401 tunnel from a valence band maximum to a conduction band minimum in a region of the epitaxial layer 500 to form a tunneling current, and under the effect of an electric field in the drain region 203, the tunneling current flows into the drain region 203 to form a leakage current; and in addition, under the effect of the electric field in the second gate region 402, a few carriers in the second source region 202 also tunnel from a valence band maximum to a conduction band minimum to form a tunneling current, and under the effect of the electric field in the drain region 203, the tunneling current flows into the drain region 203 to form a leakage current. Because the tunneling field-effect transistor shown in FIG. 4 has two source regions, each source region is controlled by a plurality of gates, and a direction of an electric field of each gate is the same as a tunneling direction of carriers in the source region, a tunneling probability of the carriers is increased. Further, there is a combined electric field at a turning point indicated by a circle in FIG. 4 and the combined electric field increases intensity of a gate electric field, and therefore a tunneling probability of carriers at the turning point is increased. In the field of semiconductor technologies, a size of a tunneling current is in direct proportion to a tunneling area and a tunneling probability. Therefore, a tunneling current is greatly increased by using the tunneling field-effect transistor shown in FIG. 4.

In the tunneling field-effect transistor provided in the present application, a dual source region design is used, so that a tunneling area of carriers in a source region is increased; a direction of an electric field applied in a gate region is the same as a tunneling direction of carriers in the source region, so that a tunneling probability is increased; and because a tunneling current is in direct proportion to the tunneling area and the tunneling probability, the tunneling current is relatively large.

Figure 7:
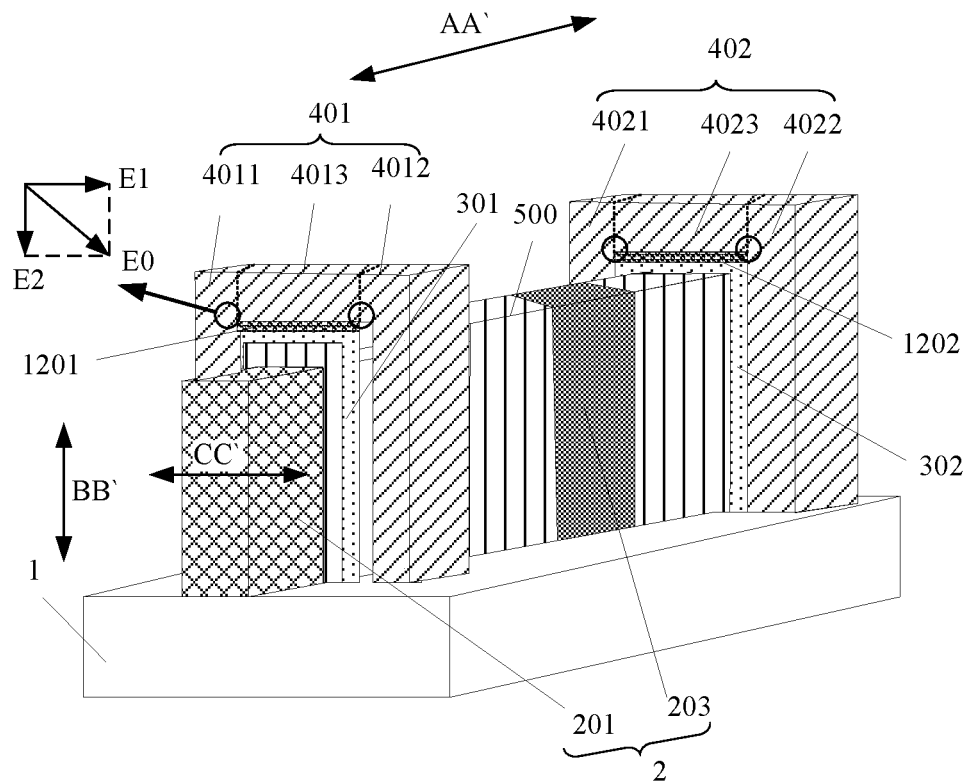
FIG. 7 is a schematic three-dimensional structural diagram of a tunneling field-effect transistor according to another embodiment of the present application.
Figure 8:
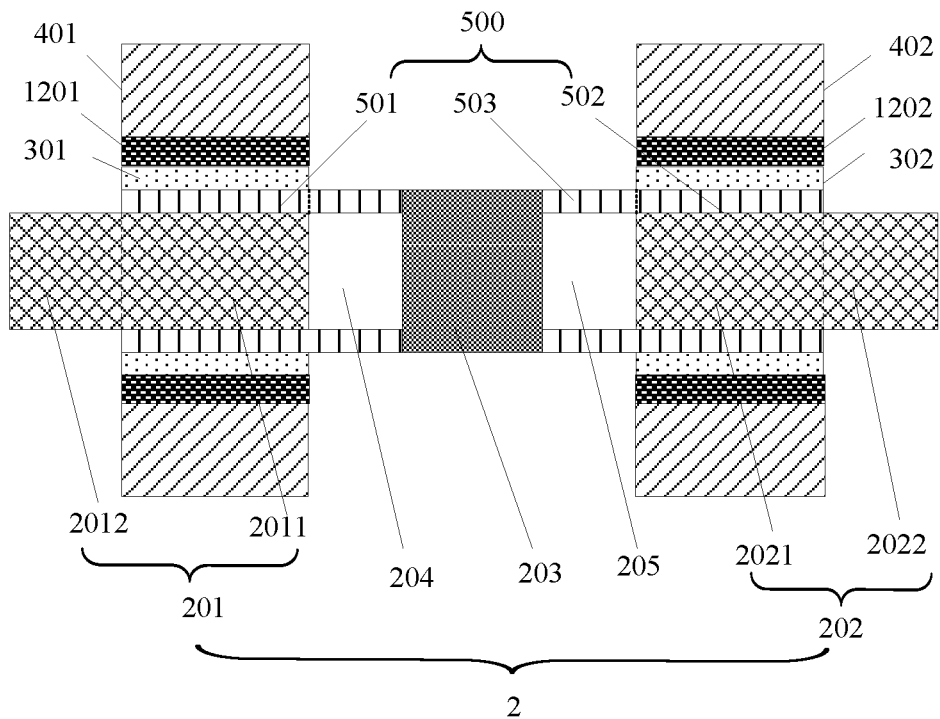
FIG. 8 is a cross-sectional view of a tunneling field-effect transistor according to another embodiment of the present application.

Based on the tunneling field-effect transistor shown in FIG. 4, an embodiment of the present application provides another tunneling field-effect transistor, and the tunneling field-effect transistor is described in detail with reference to FIG. 7 and FIG. 8. FIG. 7 is a schematic three-dimensional structural diagram of the tunneling field-effect transistor, and FIG. 8 is a cross-sectional view obtained by cutting the tunneling field-effect transistor shown in FIG. 7 along CC'. Referring to FIG. 7, the tunneling field-effect transistor includes:

a substrate layer 1;

a rectangular semiconductor strip 2 formed on an upper surface of the substrate layer 1, where the rectangular semiconductor strip 2 includes a first source region 201, a first channel region 204, a drain region 203, a second channel region 205, and a second source region 202 that are disposed in sequence along a first direction, the first direction is parallel to a length direction of the rectangular semiconductor strip 2 and is a direction indicated by AA' in FIG. 7, the first source region 201 is disposed at one end of the rectangular semiconductor strip 2, the first channel region 204 is close to the first source region 201, the drain region 203 is disposed at a middle portion of the rectangular semiconductor 2, the second channel region 205 is close to the drain region 203, the second source region 202 (which is not shown in the figure because the second source region 202 is blocked by a second gate region 402) is disposed at the other end of the rectangular semiconductor strip 2, the first source region 201 is divided into a first part 2011 and a second part 2012, the first part 2011 is close to the first channel region 204, the second source region 202 is divided into a third part 2021 and a fourth part 2022, and the third part 2021 is close to the second channel region 205;

an epitaxial layer 500 covering an outer surface of a specified region of the rectangular semiconductor strip 2, where the specified region includes a region from the first part 2011 to the third part 2021 of the rectangular semiconductor strip; and the epitaxial layer 500 includes a first epitaxial layer 501, a second epitaxial layer 502, and a third epitaxial layer 503, a first epitaxial layer 501 covers an outer surface of the first part 2011, a first epitaxial layer 501 is located between the first part 2011 and the first gate dielectric layer 301, the second epitaxial layer 502 covers an outer surface of the third part 2021, the second epitaxial layer 502 is located between the third part 2021 and the second gate dielectric layer 302, and the third epitaxial layer 503 covers an outer surface of the rectangular semiconductor strip 2 between the first part 2011 and the third part 2021;

a first gate dielectric layer 301 covering an outer surface of the first epitaxial layer 501;

a second gate dielectric layer 302 covering an outer surface of the second epitaxial layer 502;

a first isolating layer 1201 formed at a top end of the first gate dielectric layer 301;

a second isolating layer 1202 formed at a top end of the second gate dielectric layer 302;

a first gate region 401 formed at a top end of the first isolating layer 1201, a first side surface and a second side surface of the first gate dielectric layer 301, and a first outer surface and a second outer surface of the first isolating layer 1201, where the first side surface and the second side surface are two outer surfaces in the first gate dielectric layer 301 that are parallel and opposite to a plane formed by the first direction and a second direction, the first outer surface and the second outer surface of the first isolating layer 1201 are two outer surfaces in the first isolating layer 1201 that are parallel and opposite to the plane formed by the first direction and the second direction, the second direction is parallel to a height direction of the rectangular semiconductor and is a direction indicated by BB' in the figure, and a direction of an electric field applied in the first gate region 401 points to the first source region 201; and a second gate region 402 formed at a top end of the second isolating layer 1202, a third side surface and a fourth side surface of the second gate dielectric layer 302, and a third outer surface and a fourth outer surface of the second isolating layer 1202, where the third side surface and the fourth side surface are two outer surfaces in the second gate dielectric layer that are parallel and opposite to the plane formed by the first direction and the second direction, the third outer surface and the fourth outer surface of the second isolating layer 1202 are two outer surfaces in the second isolating layer 1202 that are parallel and opposite to the plane formed by the first direction and the second direction, and a direction of an electric field applied in the second gate region 402 points to the second source region 202.

In another embodiment of the present application, referring to FIG. 8, based on a location relationship between the first gate region 401 and the top end of the first gate dielectric layer 301, the first gate region 401 may include a first gate 4011, a second gate 4012, and a third gate 4013. The third gate 4013 covers a top end of the first gate dielectric layer 301, the first gate 4011 covers the first side surface of the first gate dielectric layer 301, a first outer surface of the first isolating layer 1201, and a first outer surface of the third gate 4013 along the second direction, the second gate 4012 covers the second side surface of the first gate dielectric layer 301, a second outer surface of the first isolating layer 1201, and a second outer surface of the third gate 4013 along the second direction, and the first outer surface and the second outer surface of the third gate 4013 are two outer surfaces in the third gate 4013 that are parallel and opposite to the plane formed by the first direction and the second direction.

In another embodiment of the present application, referring to FIG. 8, based on a location relationship between the second gate region 402 and the top end of the second gate dielectric layer 302, the second gate region 402 may include a fourth gate 4021, a fifth gate 4022, and a sixth gate 4023. The sixth gate 4023 covers the top end of the second isolating layer 1202, the fourth gate 4021 covers the third side surface of the second gate dielectric layer 302, a third outer surface of the second isolating layer 1202, and a third outer surface of the sixth gate 4023, the fifth gate 4022 covers the fourth side surface of the second gate dielectric layer 302, a fourth outer surface of the second isolating layer 1202, and a fourth outer surface of the sixth gate 4023 along the second direction, and the third outer surface and the fourth outer surface of the sixth gate 4023 are two outer surfaces in the sixth gate 4023 that are parallel and opposite to the plane formed by the first direction and the second direction.

Figure 9A:
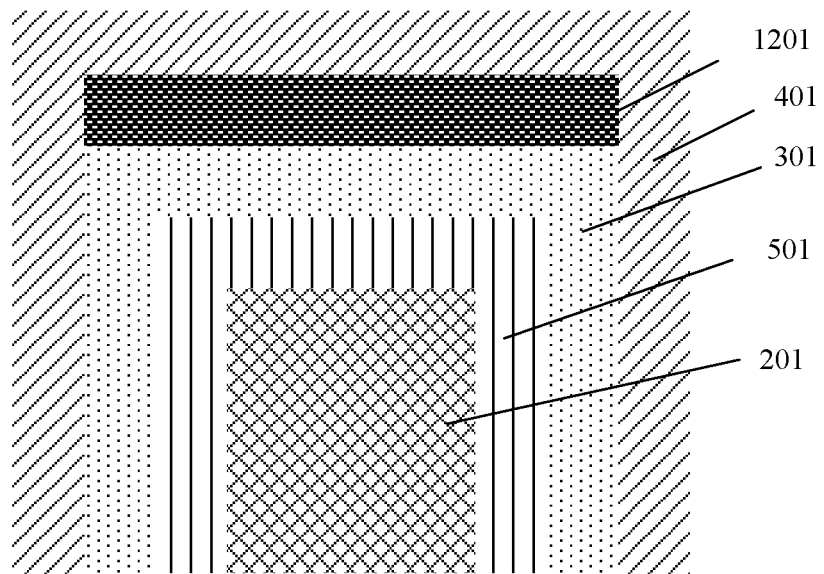
FIG. 9(A) is a left view of a tunneling field-effect transistor according to another embodiment of the present application.

FIG. 9(A) is a left view of the tunneling field-effect transistor shown in FIG. 7. It may be learned with reference to FIG. 8 and FIG. 9(A) that, the tunneling field-effect transistor includes the first source region 201, the first epitaxial layer 501, the first gate dielectric layer 301, the first isolating layer 1201, and the first gate region 401 that are disposed in sequence from inside to outside. The first source region 201 is divided into the first part 2011 and the second part 2012, the first part 2011 is close to the first channel region 204, the first epitaxial layer 501 surrounds the outer surface of the first part 2011, the first gate dielectric layer 301 surrounds an outer surface of the first epitaxial layer 501, the first isolating layer 1201 is disposed between the first gate dielectric layer 301 and first gate region 401, and the first gate region 401 surrounds two opposite sides of the first isolating layer 1201 and the first gate dielectric layer 301.

Figure 9B:
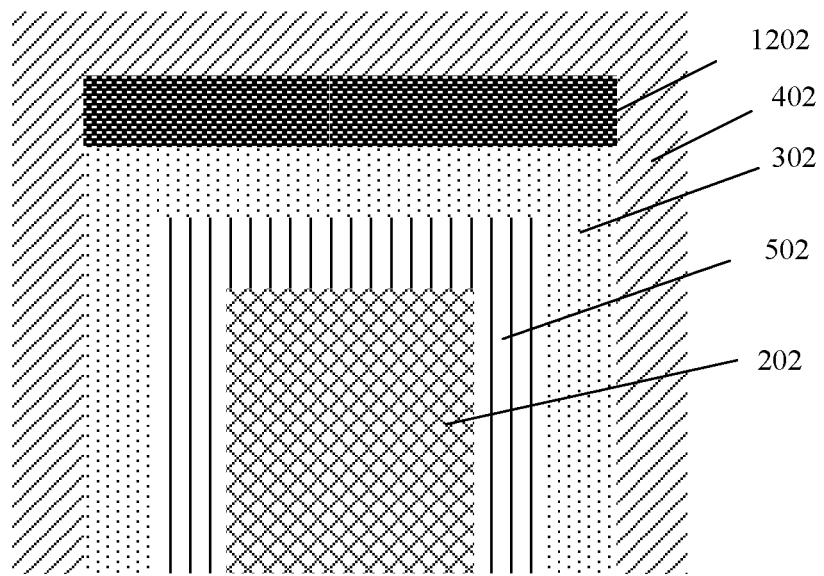
FIG. 9(B) is a right view of a tunneling field-effect transistor according to another embodiment of the present application.

FIG. 9(B) is a left view of the tunneling field-effect transistor shown in FIG. 7. It may be learned with reference to FIG. 8 and FIG. 9(B) that, the tunneling field-effect transistor includes the second source region 202, the second epitaxial layer 502, the second gate dielectric layer 302, the second isolating layer 1202, and the second gate region 402 that are disposed in sequence from inside to outside. The second source region 202 is divided into the third part 2021 and the fourth part 2022, the third part 2021 is close to the second channel region 205, the second epitaxial layer 502 surrounds the outer surface of the third part 2021, the second gate dielectric layer 302 surrounds an outer surface of the second epitaxial layer 502, the second isolating layer 1202 is disposed at the top end of the second gate dielectric layer 302, and the second gate region 402 surrounds two opposite sides of the second isolating layer 1201 and the second gate dielectric layer 302. Specifically, the fourth gate 4021 and the fifth gate 4022 are disposed at two opposite sides of the second gate dielectric layer 302, and the sixth gate 4023 is disposed on the second isolating layer 1202.

In another embodiment of the present application, the tunneling field-effect transistor includes an N-type tunneling field-effect transistor and a P-type tunneling field-effect transistor. When the tunneling field-effect transistor is an N-type tunneling field-effect transistor, the first source region and the second source region are heavily P-doped regions on the semiconductor strip, and the drain region is a heavily N-doped region on the semiconductor strip; or when the tunneling field-effect transistor is a P-type tunneling field-effect transistor, the first source region and the second source region are heavily N-doped regions on the semiconductor strip, and the drain region is a heavily P-doped region on the semiconductor strip.

A working principle of the tunneling field-effect transistor shown in FIG. 7 is as follows: In a scenario in which a forward-bias voltage is applied in the first gate region 401 and the second gate region 402, the first source region 201 and the second source region 202 are grounded, and a forward-bias voltage is applied in the drain region 203, under the effect of an electric field of a first gate 4011 and a second gate 4012 in the first gate region 401, a few carriers in the first source region 401 tunnel from a valence band maximum to a conduction band minimum in a region of the epitaxial layer 500 to form a tunneling current, and under the effect of an electric field in the drain region 203, the tunneling current flows into the drain region 203 to form a leakage current; and in addition, under the effect of an electric field of a fourth electrode 4021 and a fifth electrode 4022 in the second gate region 402, a few carriers in the second source region 202 also tunnel from a valence band maximum to a conduction band minimum to form a tunneling current, and under the effect of the electric field in the drain region 203, the tunneling current flows into the drain region 203 to form a leakage current. Because the tunneling field-effect transistor shown in FIG. 7 has two source regions, each source region is controlled by a plurality of gates, and a direction of an electric field of each gate is the same as a tunneling direction of carriers in the source region, a tunneling probability of the carriers is increased. Further, there is a combined electric field at a turning point indicated by a circle in FIG. 7 and the combined electric field increases intensity of a gate electric field, and therefore a tunneling probability of carriers at the turning point is increased. In the field of semiconductor technologies, a size of a tunneling current is in direct proportion to a tunneling area and a tunneling probability. Therefore, a tunneling current is greatly increased by using the tunneling field-effect transistor shown in FIG. 7.

In the tunneling field-effect transistor provided in the present application, a dual source region design is used, so that a tunneling area of carriers in a source region is increased; a direction of an electric field applied in a gate region is the same as a tunneling direction of carriers in the source region, so that a tunneling probability is increased; and because a tunneling current is in direct proportion to the tunneling area and the tunneling probability, the tunneling current is relatively large.

Figure 10:
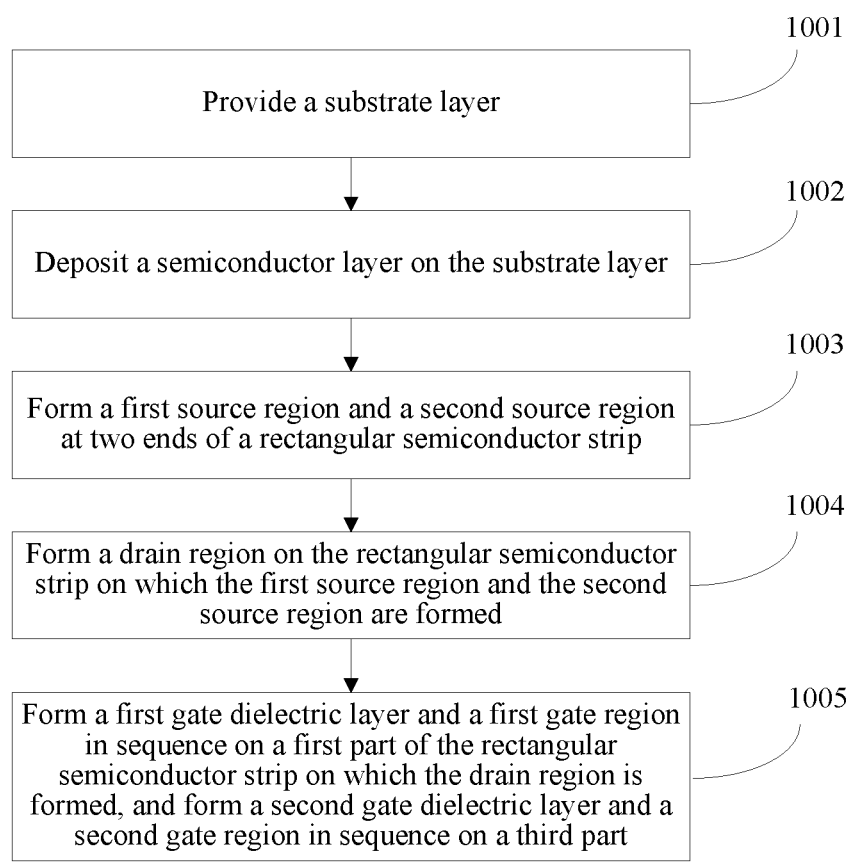
FIG. 10 is a flowchart of a method for manufacturing a tunneling field-effect transistor according to another embodiment of the present application.

An embodiment of the present application provides a method for manufacturing a tunneling field-effect transistor. The method is used to manufacture the tunneling field-effect transistor shown in FIG. 1. Referring to FIG. 10, procedures of the method provided in this embodiment of the present application include the following steps.

Figure 11:
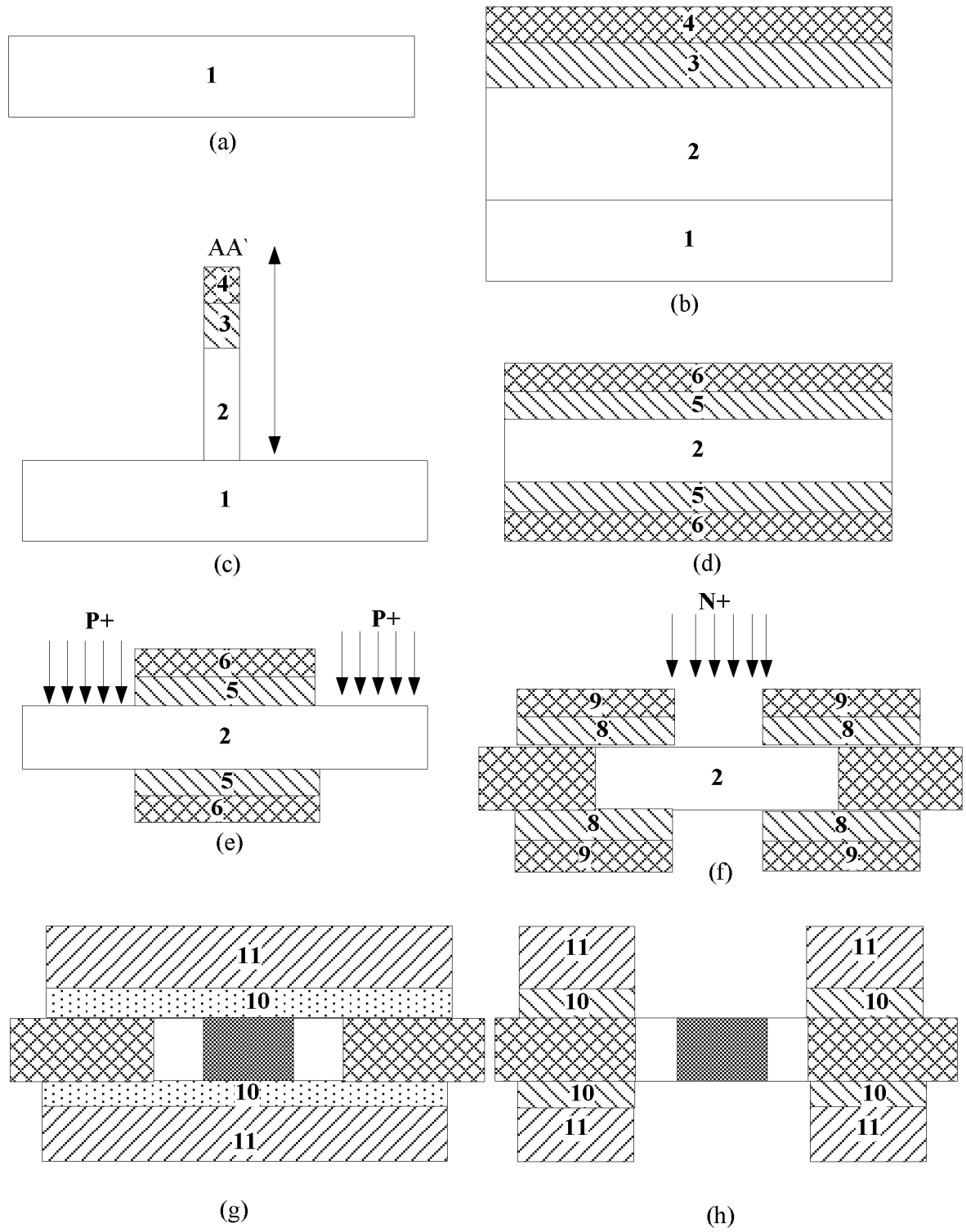
FIG. 11 is a schematic structural diagram of a to-be-manufactured tunneling field-effect transistor when each step is completed in a method for manufacturing a tunneling field-effect transistor according to another embodiment of the present application.

1001. Referring to FIG. 11 (a), provide a substrate layer.

A shape of the substrate layer 1 is a rectangle, and a material of the substrate layer 1 may be silicon, germanium, SOI (silicon on insulator), GeOI (Germanium on insulator, Germanium on insulator), a group III-V compound material, and the like. In this embodiment, for example, the substrate layer 1 is a silicon substrate.

1002. Referring to FIG. 11 (b) and FIG. 11 (c), form a rectangular semiconductor strip on the substrate layer.

The semiconductor strip 2 is an intrinsic semiconductor. The rectangular semiconductor strip 2 may be formed on the substrate layer 1 by using the following steps 100211 to 100216.

100211. Deposit a semiconductor layer 2 on the substrate layer 1.

100212. Deposit a first hard mask layer 3 on the semiconductor layer 2.

100213. Deposit a first photoresist layer 4 on the first hard mask layer 3.

Thereby, a film layer structure shown in FIG. 11(b) may be formed on the substrate layer.

100214. Etch two side parts of the first photoresist layer 4 and the first hard mask layer 3 in the first direction, that is, two side parts in a direction AA' in FIG. 11(c), to expose two sides of the semiconductor layer 2.

100215. Etch the semiconductor layer 2 to a surface of the substrate layer 1 by using a remaining first photoresist layer 4 and first hard mask layer 3 as a mask.

Thereby, a structure shown in FIG. 11(c) may be formed on the substrate layer.

100216. Remove the remaining first photoresist layer 4 and first hard mask layer 3 to form the rectangular semiconductor strip 2.

A material of the first hard mask layer 3 may be one of a silicon oxide material, silicon nitride, and silicon oxynitride. The first hard mask layer 3 is used to prevent impact caused by an etchant on a material below the first hard mask layer 3 during etching. The foregoing deposition process of depositing the semiconductor layer 2, the first hard mask layer 3, the first photoresist layer 4 in sequence on the substrate layer 1 may be implemented through low pressure chemical vapor deposition (LPCVD) or physical vapor deposition (PVD).

In addition to steps 100211 to 100216, the rectangular semiconductor strip 2 may be formed on the substrate layer 1 by using the following steps 100221 to 100230:

100221. Deposit a first hard mask layer 3 on the substrate layer 1.

100222. Deposit a first photoresist layer 4 on the first hard mask layer 3.

100223. Etch a middle part of the first photoresist layer 4 in the first direction to expose a middle part of the first hard mask layer 3 in the first direction.

100224. Etch the middle part of the first hard mask layer 3 in the first direction to a surface of the substrate layer 1.

100225. Deposit a semiconductor layer 2 by using a remaining first photoresist layer 4 as a mask.

100226. Etch the semiconductor layer 2 that is deposited on an upper surface of the remaining first photoresist layer 4 and the remaining first photoresist layer 4.

100227. Deposit a second hard mask layer 3' on the substrate layer 1.

100228. Etch two side parts of the second hard mask layer 3' in the first direction to expose two side parts of the first hard mask layer 3 in the first direction.

100229. Etch the two side parts of the first hard mask layer 3 in the first direction by using a remaining second hard mask layer 3' as a mask.

100230. Remove the remaining second hard mask layer 3' to form the rectangular semiconductor strip 2.

Materials of the first hard mask layer 3 and the second hard mask layer 3' may be one of a silicon oxide material, silicon nitride, and silicon oxynitride. The foregoing deposition process of depositing the semiconductor layer 2, the first hard mask layer 3, the first photoresist layer 4, and the second hard mask layer 3' may be implemented through low pressure chemical vapor deposition (LPCVD) or physical vapor deposition (PVD).

1003. Referring to FIG. 11(d) and FIG. 11(e), form a first source region and a second source region at two ends of the rectangular semiconductor strip.

The first source region 201 and the second source region 202 are two source regions of the tunneling field-effect transistor. The first source region 201 and the second source region 202 are disposed at the two ends of the rectangular semiconductor strip along a first direction. If one source region on the rectangular semiconductor strip is referred to as the first source region 201, the other source region may be referred to as the second source region 202. The first source region includes a first part and a second part, the first part is close to a first channel region, the second source region includes a third part and a fourth part, and the third part is close to a second channel region.

When the first source region and the second source region are formed on the rectangular semiconductor strip, the following steps 10031 to 10034 may be used:

10031. Referring to FIG. 11(d), deposit a third hard mask layer 5 and a second photoresist layer 6 in sequence at two sides of the semiconductor strip 2 along a second direction, where the second direction is parallel to a height direction of the rectangular semiconductor strip and is a direction indicated by BB' in FIG. 1.

10032. Etch two side parts of the second photoresist layer 6 and the third hard mask layer 5 in the second direction, and reserve middle parts of the second photoresist layer 6 and the third hard mask layer 5 in the second direction.

10033. Inject first-type doping ions into the two side parts of the rectangular semiconductor strip 2 in the second direction by using a remaining second photoresist layer 6 and third hard mask layer 5 as a mask.

10034. Referring to FIG. 11(e), remove the remaining second photoresist layer 6 and third hard mask layer 5 to form the first source region 201 and the second source region 202 at the two ends of the semiconductor strip 2.

It should be noted herein that, after the first-type ions are injected, a rapid thermal annealing process needs to be performed to activate impurities injected in the ion injection process, to form the first source region 201 and the second source region 202.

A material of the third hard mask layer 5 may be one of a silicon oxide material, silicon nitride, and silicon oxynitride. The foregoing deposition process of depositing the third hard mask layer 5 and the second photoresist layer 6 may be implemented through low pressure chemical vapor deposition (LPCVD) or physical vapor deposition (PVD).

In this embodiment, a material of the rectangular semiconductor strip 2 may be silicon, germanium, a group IV compound material, a group III-V compound material, and the like, and a doping concentration of ions in the rectangular semiconductor strip 2 may be $1e^{18}$ to $1e^{21}$ $cm^{-3}$. Because the tunneling field-effect transistor includes an N-type tunneling field-effect transistor and a P-type tunneling field-effect transistor, when the tunneling field-effect transistor is an N-type tunneling field-effect transistor, the first source region 201 and the second source region 202 are heavily P-doped regions on the rectangular semiconductor strip 2, and the drain region 203 is a heavily N-doped region on the rectangular semiconductor strip 2; or when the tunneling field-effect transistor is a P-type tunneling field-effect transistor, the first source region 201 and the second source region 202 are heavily N-doped regions on the rectangular semiconductor strip 2, and the drain region 203 is a heavily P-doped region on the rectangular semiconductor strip. Therefore, if P-type doping is performed on a silicon material-based tunneling field-effect transistor, the first-type doping ions may be B, Al, Ga, In, Ti, Pd, Na, Be, Zn, Au, Co, V, Ni, Mo, Hg, Sr, Ge, W, Pb, O, Fe, and the like; or if N-type doping is performed on a silicon material-based tunneling field-effect transistor, the first-type doping ions may be Li, Sb, P, As, Bi, Te, Ti, C, Mg, Se, Cr, Ta, Cs, B, S, Mn, Ag, Cd, Pt, and the like. If P-type doping is performed on a germanium material-based tunneling field-effect transistor, the first-type doping ions may be B, Al, Ga, In, Be, Zn, Cr, Cd, Hg, Co, Ni, Mn, Fe, Pt, and the like; or if N-type doping is performed on a germanium material-based tunneling field-effect transistor, the first-type doping ions may be Li, Sb, P, As, S, Se, Te, Cu, Au, Ag, and the like.

1004. Referring to FIG. 11(*f*), form a drain region on the rectangular semiconductor strip on which the first source region and the second source region are formed.

The drain region 203 is spaced with a preset distance from both the first source region 201 and the second source region 202, a first channel region 204 is formed between the first source region 201 and the drain region 203, and a second channel region 205 is formed between the second source region 202 and the drain region 203.

The drain region may be formed on the semiconductor strip by using the following steps 10041 to 10044:

10041. Deposit a fourth hard mask layer 8 and a third photoresist layer 9 in sequence along a second direction at the two sides of the rectangular semiconductor strip on which the first source region and the second source region are formed, where the second direction is parallel to a height direction of the rectangular semiconductor strip.

10042. Etch middle parts of the third photoresist layer 9 and the fourth hard mask layer 8 in the second direction, and reserve two side parts of the third photoresist layer 9 and the fourth hard mask layer 8 in the second direction.

10043. Inject, by using a remaining third photoresist layer 9 and fourth hard mask layer 8 as a mask, second-type doping ions into a middle portion of the rectangular semiconductor strip on which the first source region and the second source region are formed.

10044. Remove the remaining third photoresist layer 9 and fourth hard mask layer 8 to form the drain region 203.

A material of the fourth hard mask layer 8 may be one of a silicon oxide material, silicon nitride, and silicon oxynitride. The foregoing deposition process of depositing the fourth hard mask layer 8 and the third photoresist layer 9 may be implemented through low pressure chemical vapor deposition (LPCVD) or physical vapor deposition (PVD).

It should be noted that, after the second-type ions are injected, a rapid thermal annealing process needs to be performed to activate impurities injected in the ion injection process, to form the drain region 203.

1005. Referring to FIG. 9(*g*) and FIG. 9(*h*), form a first gate dielectric layer and a first gate region in sequence on the first part of the rectangular semiconductor strip on which the drain region is formed, and form a second gate dielectric layer and a second gate region in sequence on the third part.

During specific implementation of this process, the following steps 10051 to 10053 may be used:

10051. Deposit a gate dielectric layer 10 on the rectangular semiconductor strip 2 on which the first source region 201, the second source region 202, and the drain region 203 are formed.

A material of the gate dielectric layer 10 may be one of silicon dioxide and a high-k dielectric material.

10052. Deposit a gate layer 11 on the gate dielectric layer 10.

A material of the gate layer 11 may be one of polycrystalline silicon and metal.

10053. Etch the gate dielectric layer 10 and the gate layer 11, to form the first gate dielectric layer 301 and the first gate region 401 in sequence on the first part 2011 of the first source region 201 and form the second gate dielectric layer 302 and the second gate region 402 in sequence on the third part 2021 of the second source region 202.

The first gate region 401 includes a first gate 4011, a second gate 4012, and a third gate 4013, the first gate 4011 covers a first side surface of the first gate dielectric layer 301 along a second direction, the second gate 4012 covers a second side surface of the first gate dielectric layer 301 along the second direction, the third gate 4013 covers a top end of the first gate dielectric layer 301, the second direction is parallel to a height direction of the rectangular semiconductor, and the first side surface and the second side surface are two opposite outer surfaces of the first gate dielectric layer.

The second gate region 402 includes a fourth gate 4021, a fifth gate 4022, and a sixth gate 4023, the fourth gate 4021 covers a third side surface of the second gate dielectric layer 302 along the second direction, the fifth gate covers a fourth side surface of the second gate dielectric layer 302, the sixth gate 4023 covers a top end of the second gate dielectric layer 302, and the third side surface and the fourth side surface are two opposite outer surfaces of the second gate dielectric layer.

The foregoing deposition process of depositing the gate dielectric layer 10 and the gate layer 11 may be implemented through low pressure chemical vapor deposition (LPCVD) or physical vapor deposition (PVD).

In this embodiment, the electric field in the first gate region 401 can reinforce an effect on carriers inside the first source region 201, and the electric field in the second gate region 402 can reinforce an effect on carriers inside the second source region 202, so that a tunneling current is increased.

After the first gate dielectric layer and the first gate region are formed in sequence on the first part of the rectangular semiconductor strip on which the drain region is formed, and the second gate dielectric layer and the second gate region are formed in sequence on the third part, according to the method provided in this embodiment, a side wall may be deposited in the first gate region 401 and the second gate region 402. A material of the side wall may be one of silicon oxide, silicon nitride, a high-k dielectric or another insulating material, and the side wall is used to separate the first gate region 401 and the second gate region 402 from other components outside the tunneling field-effect transistor.

After the side wall is deposited in the first gate region 401 and the second gate region 402, according to the method provided in this embodiment of the present application, a contact process and a backend interconnection process is further performed on the substrate layer 1 on which the side wall is deposited, to form an electrode connected structure. During specific implementation, a metal contact process such as a CMOS process may be used. After etching is performed by using an Argon ion beam, Co ion beam deposition and TiN ion beam deposition may be performed on a surface, then a rapid thermal annealing process is performed, Co and TiN are removed, and finally, a passivation layer is deposited, holes are formed on a contact surface through a punching process, and a metal layer is formed through a deposition process, to form an electrode structure.

In the method provided in this embodiment of the present application, a dual source region design is used, so that a tunneling area of carriers in a source region is increased; a direction of an electric field applied in a gate region is the same as a tunneling direction of carriers in the source region, so that a tunneling probability is increased; and because a tunneling current is in direct proportion to the tunneling area and the tunneling probability, the tunneling current is relatively large.

Figure 12:
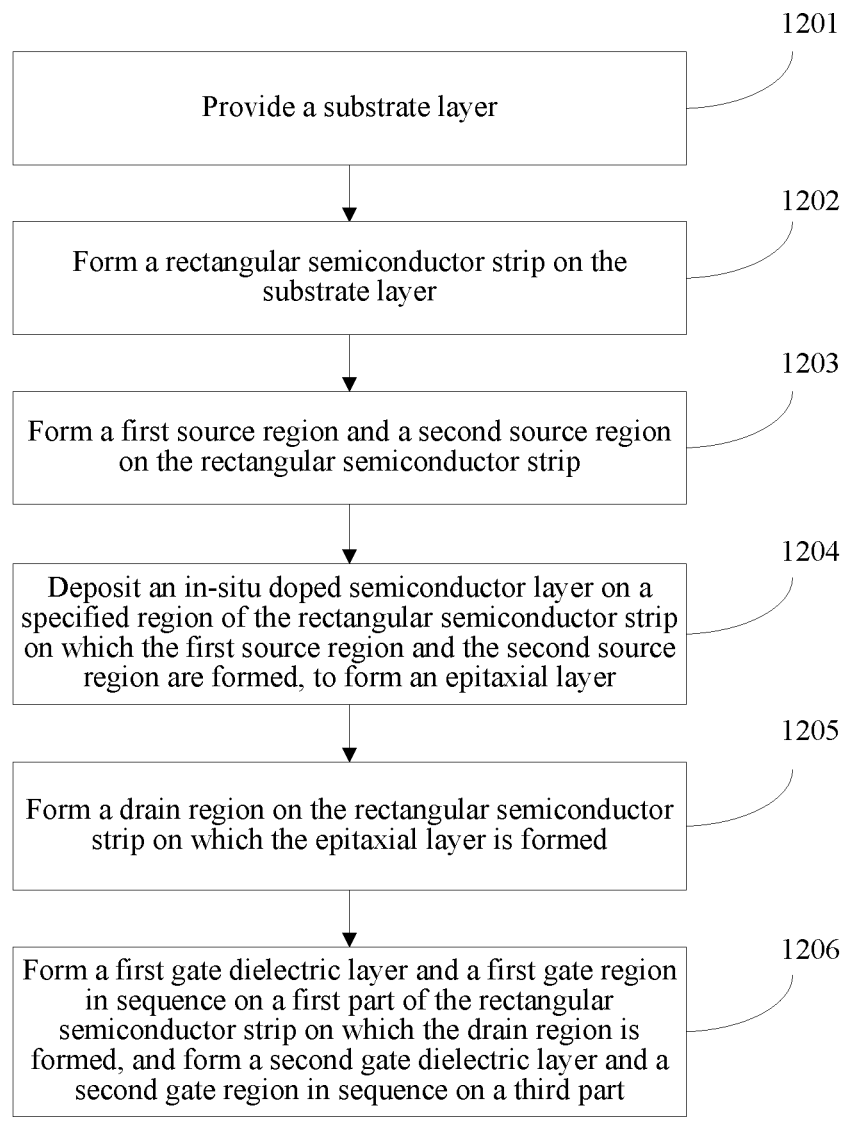
FIG. 12 is a flowchart of a method for manufacturing a tunneling field-effect transistor according to another embodiment of the present application.

An embodiment of the present application provides a method for manufacturing a tunneling field-effect transistor. The method is used to manufacture the tunneling field-effect transistor shown in FIG. 4. Referring to FIG. 12, procedures of the method provided in this embodiment include the following steps.

Figure 13:
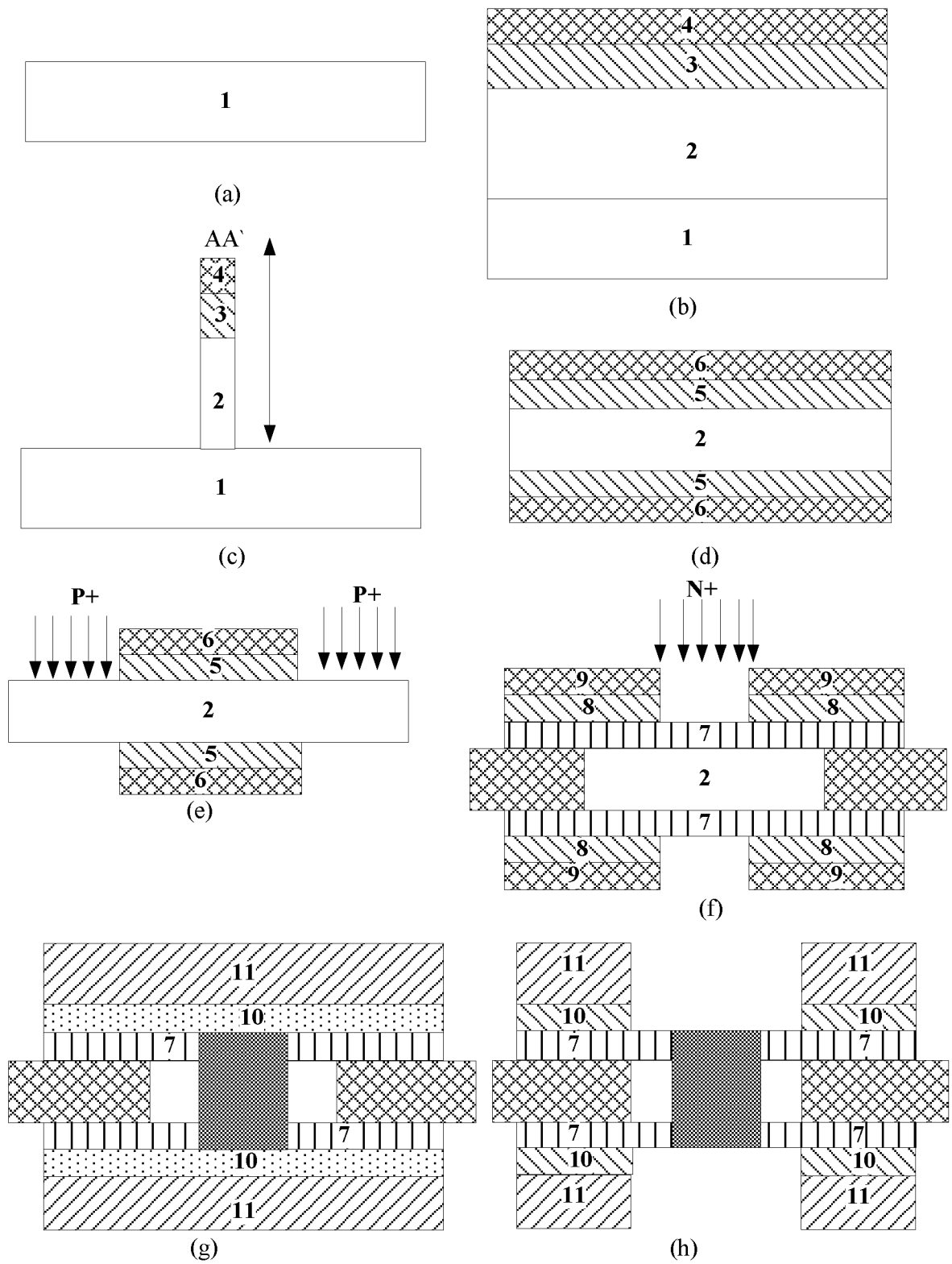
FIG. 13 is a schematic structural diagram of a to-be-manufactured tunneling field-effect transistor when each step is completed in a method for manufacturing a tunneling field-effect transistor according to another embodiment of the present application.

1201. Referring to FIG. 13(*a*), provide a substrate layer.

During specific implementation, this step is the same as step 1001. For details, refer to step 1001. Details are not described herein again.

1202. Referring to FIG. 13(*b*) and FIG. 13(*c*), form a rectangular semiconductor strip on the substrate layer.

During specific implementation, this step is the same as step 1002. For details, refer to step 1002. Details are not described herein again.

1203. Referring to FIG. 11(*d*) and FIG. 11(*e*), form a first source region and a second source region on the rectangular semiconductor strip.

During specific implementation, this step is the same as step 1003. For details, refer to step 1003. Details are not described herein again.

1204. Deposit an in-situ doped semiconductor layer on a specified region of the rectangular semiconductor strip on which the first source region and the second source region are formed, to form an epitaxial layer.

The specified region includes a region from the first part to the third part of the rectangular semiconductor strip, the epitaxial layer 500 includes a first epitaxial layer 501, a second epitaxial layer 502, and a third epitaxial layer 503, the first epitaxial layer 501 covers an upper surface of the first part 2011, the first epitaxial layer 501 is located between the first part and the first gate dielectric layer 301, the second epitaxial layer 502 covers an upper surface of the third part 2021, the second epitaxial layer 502 is located between the third part 2021 and the second gate dielectric layer 302, the third epitaxial layer 503 covers an upper surface of the rectangular semiconductor strip between the first part 2011 and the third part 2021, the first epitaxial layer 501 and the first part 2011 form a first tunneling junction, and the second epitaxial layer 502 and the third part 2021 form a second tunneling junction. During specific manufacturing, the epitaxial layer 500 may be manufactured by depositing an N-type in-situ doped semiconductor layer through an epitaxial deposition process such as MBE, LP, or CVD.

Figure 15:
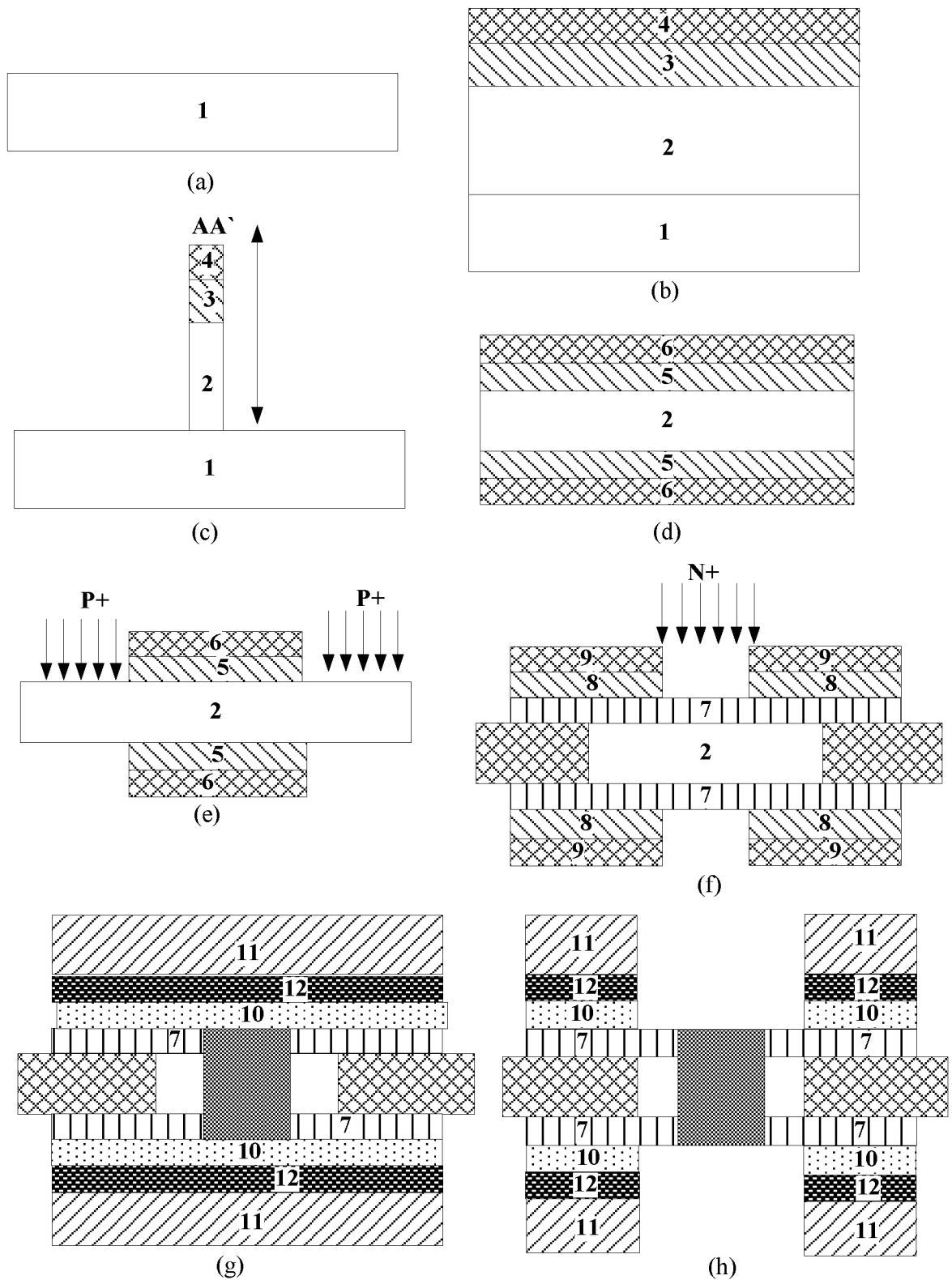
FIG. 15 is a schematic structural diagram of a to-be-manufactured tunneling field-effect transistor when each step is completed in a method for manufacturing a tunneling field-effect transistor according to another embodiment of the present application.

1205. Referring to FIG. 15(*f*), form a drain region on the rectangular semiconductor strip on which the epitaxial layer is formed.

A specific implementation of this step is the same as step 1004, and a difference lies in that in step 1004, the drain region 203 is formed on the rectangular semiconductor strip 2 by depositing the third photoresist layer 9 and the fourth hard mask layer 8 and patterning the third photoresist layer 9 and the fourth hard mask layer 8, but in this step, the drain region 203 is formed by depositing the third photoresist layer 9 and the fourth hard mask layer 8 on the rectangular semiconductor strip 2 on which the epitaxial layer 500 is deposited, and patterning the third photoresist layer 9 and the fourth hard mask layer 8.

1206. Referring to FIG. 15(*g*) and FIG. 15(*h*), form a first gate dielectric layer and a first gate region in sequence on the first part of the rectangular semiconductor strip on which the drain region is formed, and form a second gate dielectric layer and a second gate region in sequence on the third part.

During specific implementation, this step is the same as step 1005. For details, refer to step 1005. Details are not described herein again.

After the first gate dielectric layer and the first gate region are formed in sequence on the first part of the rectangular semiconductor strip on which the drain region is formed, and the second gate dielectric layer and the second gate region are formed in sequence on the third part, according to the method provided in this embodiment, a side wall is further deposited in the first gate region 401 and the second gate region 402. A material of the side wall may be one of silicon oxide, silicon nitride, a high-k dielectric or another insulating material, and the side wall is used to separate the first gate region 401 and the second gate region 402 from other components outside the tunneling field-effect transistor.

After the side wall is deposited in the first gate region 401 and the second gate region 402, according to the method provided in this embodiment of the present application, a contact process and a backend interconnection process is further performed on the substrate layer 1 on which the side wall is deposited, to form an electrode connected structure. During specific implementation, a metal contact process such as a CMOS process may be used. After etching is performed by using an Argon ion beam, Co ion beam deposition and TiN ion beam deposition may be performed on a surface, then a rapid thermal annealing process is performed, Co and TiN are removed, and finally, a passivation layer is deposited, holes are formed on a contact surface through a punching process, and a metal layer is formed through a deposition process, to form an electrode structure.

In the method provided in this embodiment of the present application, a dual source region design is used, so that a tunneling area of carriers in a source region is increased; a direction of an electric field applied in a gate region is the same as a tunneling direction of carriers in the source region, so that a tunneling probability is increased; and because a tunneling current is in direct proportion to the tunneling area and the tunneling probability, the open-state tunneling current is relatively large.

Figure 14:
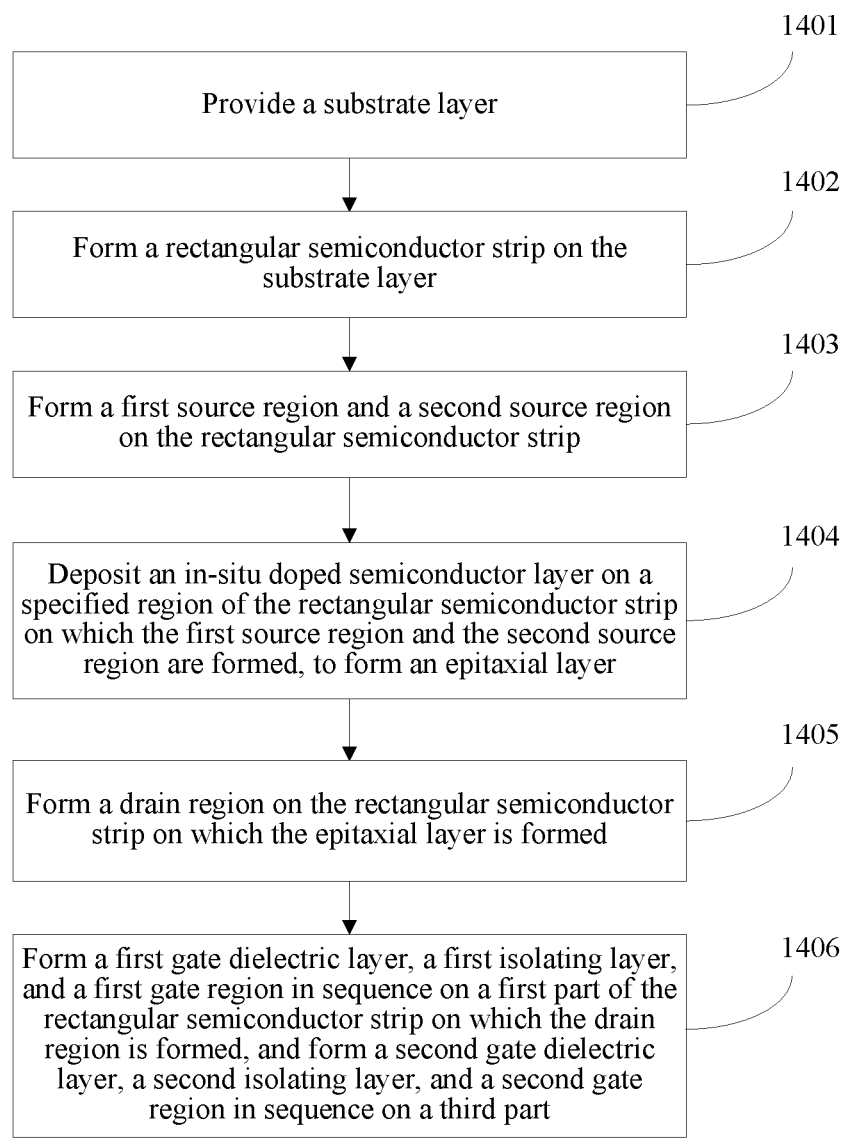
FIG. 14 is a flowchart of a method for manufacturing a tunneling field-effect transistor according to another embodiment of the present application.

An embodiment of the present application provides a method for manufacturing a tunneling field-effect transistor. The method is used to manufacture the tunneling field-effect transistor shown in FIG. 7. Referring to FIG. 14, procedures of the method provided in this embodiment include the following steps.

1401. Referring to FIG. 15(a), provide a substrate layer.

During specific implementation, this step is the same as step 1001. For details, refer to step 1001. Details are not described herein again.

1402. Referring to FIG. 15(b) and FIG. 15(c), form a rectangular semiconductor strip on the substrate layer.

During specific implementation, this step is the same as step 1002. For details, refer to step 1002. Details are not described herein again.

1403. Referring to FIG. 15(d) and FIG. 15(e), form a first source region and a second source region on the rectangular semiconductor strip.

During specific implementation, this step is the same as step 1003 For details, refer to step 1003. Details are not described herein again.

1404. Deposit an in-situ doped semiconductor layer on a specified region of the rectangular semiconductor strip on which the first source region and the second source region are formed, to form an epitaxial layer.

During specific implementation, this step is the same as step 1204. For details, refer to step 1204. Details are not described herein again.

1405. Referring to FIG. 15(f), form a drain region on the rectangular semiconductor strip on which the epitaxial layer is formed.

During specific implementation, this step is the same as step 1205. For details, refer to step 1205. Details are not described herein again.

1406. Referring to FIG. 15(g) and FIG. 15(h), form a first gate dielectric layer, a first isolating layer, and a first gate region in sequence on the first part of the rectangular semiconductor strip on which the drain region is formed, and form a second gate dielectric layer, a second isolating layer, and a second gate region in sequence on the third part.

During specific implementation of the foregoing process, the following steps 14061 to 14064 may be used:

14061. Deposit a gate dielectric layer 10 on the rectangular semiconductor strip 2 on which the first source region 201, the second source region 202, and the drain region 203 are formed.

A material of the gate dielectric layer 10 may be one of silicon dioxide and a high-k dielectric material.

14062. Deposit an isolating layer 12 at a top end of the gate dielectric layer 10.

14063. Deposit a gate layer 11 on the gate dielectric layer 10 and the isolating layer.

A material of the gate layer 11 may be one of polycrystalline silicon and metal.

14064. Etch the gate dielectric layer 10, the isolating layer 12, and the gate layer 11, to form the first gate dielectric layer 301, a first isolating layer 1201, and the first gate region 401 in sequence on the first part 2011 of the first source region 201 and form the second gate dielectric layer 402, a second isolating layer 1202, and the second gate region 402 in sequence on the third part 2021 of the second source region 202.

The first gate region 401 includes a first gate 4011, a second gate 4012, and a third gate 4013, the first gate 4011 covers a first side surface of the first gate dielectric layer 301 along a second direction, the second gate 4012 covers a second side surface of the first gate dielectric layer 301 along the second direction, the third gate 4013 covers a top end of the first gate dielectric layer 301, the second direction is parallel to a height direction of the rectangular semiconductor, and the first side surface and the second side surface are two opposite outer surfaces of the first gate dielectric layer.

The second gate region 402 includes a fourth gate 4021, a fifth gate 4022, and a sixth gate 4023, the fourth gate 4021 covers a third side surface of the second gate dielectric layer 302 along the second direction, the fifth gate covers a fourth side surface of the second gate dielectric layer 302, the sixth gate 4023 covers a top end of the second gate dielectric layer 302, and the third side surface and the fourth side surface are two opposite outer surfaces of the second gate dielectric layer.

The foregoing deposition process of depositing the gate dielectric layer 10 and the gate layer 11 may be implemented through low pressure chemical vapor deposition (LPCVD) or physical vapor deposition (PVD).

In this embodiment, the electric field in the first gate region 401 can reinforce an effect on carriers inside the first source region 201, and the electric field in the second gate region 402 can reinforce an effect on carriers inside the second source region 202, so that a tunneling current is increased.

After the first gate dielectric layer and the first gate region are formed in sequence on the first part of the rectangular semiconductor strip on which the drain region is formed, and the second gate dielectric layer and the second gate region are formed in sequence on the third part, according to the method provided in this embodiment, a side wall is deposited in the first gate region 401 and the second gate region 402. A material of the side wall may be one of silicon oxide, silicon nitride, a high-k dielectric or another insulating material, and the side wall is used to separate the first gate region 401 and the second gate region 402 from other components outside the tunneling field-effect transistor.

After the side wall is deposited in the first gate region 401 and the second gate region 402, according to the method provided in this embodiment of the present application, a contact process and a backend interconnection process is further performed on the substrate layer 1 on which the side wall is deposited, to form an electrode connected structure. During specific implementation, a metal contact process such as a CMOS process may be used. After etching is performed by using an Argon ion beam, Co ion beam deposition and TiN ion beam deposition may be performed on a surface, then a rapid thermal annealing process is performed, Co and TiN are removed, and finally, a passivation layer is deposited, holes are formed on a contact surface through a punching process, and a metal layer is formed through a deposition process, to form an electrode structure.

In the method provided in this embodiment of the present application, a dual source region design is used, so that a tunneling area of carriers in a source region is increased; a direction of an electric field applied in a gate region is the same as a tunneling direction of carriers in the source region, so that a tunneling probability is increased; and because a tunneling current is in direct proportion to the tunneling area and the tunneling probability, the tunneling current is relatively large.

Persons of ordinary skill in the art may understand that all or some of the steps of the embodiments may be implemented by using hardware or a program instructing related hardware. The program may be stored in a computer-readable storage medium. The storage medium may be a read-only memory, a magnetic disk, an optical disc, or the like.

The foregoing descriptions are merely examples of embodiments of the present application, but are not intended to limit the present application. Any modification, equivalent replacement, and improvement made without departing from the spirit and principle of the present application shall fall within the protection scope of the present application.

What is claimed is:

1. A tunneling field-effect transistor, comprising:
a substrate layer;
a rectangular semiconductor strip formed on an upper surface of the substrate layer, wherein the rectangular semiconductor strip comprises a first source region, a first channel region, a drain region, a second channel region, and a second source region that are disposed in sequence along a first direction, wherein the first direction is parallel to a length direction of the rectangular semiconductor strip, wherein the first source region is disposed at one end of the rectangular semiconductor strip, wherein the first channel region is between the first source region and the drain region, wherein the drain region is disposed at a middle portion of the rectangular semiconductor strip, wherein the second channel region is between the drain region and the second source region, wherein the second source region is disposed at another end of the rectangular semiconductor strip, wherein the first source region is divided into a first part and a second part, wherein the first part is between the first channel region and the second part, wherein the second source region is divided into a third part and a fourth part, and wherein the third part is between the second channel region and the fourth part;
a first gate dielectric layer covering an outer surface of the first part of the first source region;
a second gate dielectric layer covering an outer surface of the third part of the second source region;
a first gate region comprising a first gate, a second gate, and a third gate that together surround a top end, a first side surface, and a second side surface of the first gate dielectric layer, wherein the first side surface and the second side surface are two outer surfaces of the first gate dielectric layer that are parallel and opposite to a plane formed by the first direction and a second direction parallel to a height direction of the rectangular semiconductor, and wherein a direction of an electric field applied in the first gate region points to the first source region; and
a second gate region comprising a fourth gat, a fifth gate, and a sixth gate that together surround a top end, a third side surface, and a fourth side surface of the second gate dielectric layer, wherein the third side surface and the fourth side surface are two outer surfaces of the second gate dielectric layer that are parallel and opposite to the plane formed by the first direction and the second direction, and wherein a direction of an electric field applied in the second gate region points to the second source region,
wherein the third gate covers the top end of the first gate dielectric layer, wherein the first gate covers the first side surface of the first gate dielectric layer and a first outer surface of the third gate along the second direction, wherein the second gate covers the second side surface of the first gate dielectric layer and a second outer surface of the third gate along the second direction, wherein the first outer surface and the second outer surface are two outer surfaces of the third gate that are parallel and opposite to the plane formed by the first direction and the second direction, wherein the sixth gate covers the top end of the second gate dielectric layer, wherein the fourth gate covers the third side surface of the second gate dielectric layer and a third outer surface of the sixth gate, wherein the fifth gate covers the fourth side surface of the second gate dielectric layer and a fourth outer surface of the sixth gate along the second direction, and wherein the third outer surface and the fourth outer surface are two outer surfaces of the sixth gate that are parallel and opposite to the plane formed by the first direction and the second direction.

2. The tunneling field-effect transistor of claim 1, further comprising an epitaxial layer covering a region of the rectangular semiconductor strip, wherein the region of the rectangular semiconductor strip comprises a region from the first part to the third part of the rectangular semiconductor strip, wherein the epitaxial layer comprises a first epitaxial layer, a second epitaxial layer, and a third epitaxial layer, wherein the first epitaxial layer covers the outer surface of the first part, wherein the first epitaxial layer is located between the first part and the first gate dielectric layer, wherein the second epitaxial layer covers the outer surface of the third part, wherein the second epitaxial layer is located between the third part and the second gate dielectric layer, wherein the third epitaxial layer covers an outer surface of the rectangular semiconductor strip between the first part and the third part, wherein the first epitaxial layer and the first part form a first tunneling junction, and wherein the second epitaxial layer and the third part form a second tunneling junction.

3. The tunneling field-effect transistor of claim 2, further comprising:
a first isolating layer disposed between the first gate dielectric layer and the third gate; and
a second isolating layer disposed between the second gate dielectric layer and the sixth gate.

4. A field-effect transistor, comprising:
a substrate layer;
a rectangular semiconductor strip formed on an upper surface of the substrate layer, wherein the rectangular semiconductor strip comprises a first source region, a first channel region, a drain region, a second channel region, and a second source region that are disposed in sequence along a first direction, wherein the first direction is parallel to a length direction of the rectangular semiconductor strip, wherein the first source region is disposed at one end of the rectangular semiconductor strip, wherein the first channel region is between the first source region and the drain region, wherein the drain region is disposed at a middle portion of the rectangular semiconductor strip, wherein the second channel region is between the drain region and the second source region, wherein the second source region is disposed at another end of the rectangular semiconductor strip, wherein the first source region is divided into a first part and a second part, wherein the first part is between the first channel region and the second part, wherein the second source region is divided into a third part and a fourth part, and wherein the third part is between the second channel region and the fourth part;
a first gate dielectric layer covering an outer surface of the first part of the first source region;
a second gate dielectric layer covering an outer surface of the third part of the second source region;
a first gate region comprising a first gate, a second gate, and a third gate that together surround a top end, a first side surface, and a second side surface of the first gate dielectric layer, wherein the first side surface and the second side surface are two outer surfaces of the first gate dielectric layer that are parallel and opposite to a plane formed by the first direction and a second direction parallel to a height direction of the rectangular semiconductor; and a second gate region comprising a fourth gate, a fifth gate, and a sixth gate that together surround a top end, a third side surface, and a fourth side surface of the second gate dielectric layer, wherein the third side surface and the fourth side surface are two outer surfaces of the second gate dielectric layer that are parallel and opposite to the plane formed by the first direction and the second direction, wherein the third gate covers the top end of the first gate dielectric layer, wherein the first gate covers the first side surface of the first gate dielectric layer and a first outer surface of the third gate along the second direction, and wherein the second gate covers the second side surface of the first gate dielectric layer and a second outer surface of the third gate along the second direction.

5. The field-effect transistor of claim 4, wherein a direction of an electric field applied in the first gate region points to the first source region.

6. The field-effect transistor of claim 4, wherein a direction of an electric field applied in the second gate region points to the second source region.

7. The field-effect transistor of claim 4, wherein the first outer surface and the second outer surface are two outer surfaces of the third gate that are parallel and opposite to the plane formed by the first direction and the second direction, wherein the sixth gate covers the top end of the second gate dielectric layer, wherein the fourth gate covers the third side surface of the second gate dielectric layer and a third outer surface of the sixth gate, wherein the fifth gate covers the fourth side surface of the second gate dielectric layer and a fourth outer surface of the sixth gate along the second direction, and wherein the third outer surface and the fourth outer surface are two outer surfaces of the sixth gate that are parallel and opposite to the plane formed by the first direction and the second direction.

8. The field-effect transistor of claim 7, further comprising an epitaxial layer covering a region of the rectangular semiconductor strip, wherein the region of the rectangular semiconductor strip comprises a region from the first part to the third part of the rectangular semiconductor strip.

9. The field-effect transistor of claim 8, wherein the epitaxial layer comprises a first epitaxial layer, a second epitaxial layer, and a third epitaxial layer, wherein the first epitaxial layer covers the outer surface of the first part, wherein the first epitaxial layer is located between the first part and the first gate dielectric layer, wherein the second epitaxial layer covers the outer surface of the third part, wherein the second epitaxial layer is located between the third part and the second gate dielectric layer, wherein the third epitaxial layer covers an outer surface of the rectangular semiconductor strip between the first part and the third part, wherein the first epitaxial layer and the first part form a first tunneling junction, and wherein the second epitaxial layer and the third part form a second tunneling junction.

10. The field-effect transistor of claim 9, further comprising:

a first isolating layer disposed between the first gate dielectric layer and the third gate; and a second isolating layer disposed between the second gate dielectric layer and the sixth gate.

11. A field-effect transistor, comprising:

a substrate layer;

a rectangular semiconductor strip formed on an upper surface of the substrate layer, wherein the rectangular semiconductor strip comprises a first source region, a first channel region, a drain region, a second channel region, and a second source region that are disposed in sequence along a first direction, wherein the first source region is disposed at one end of the rectangular semiconductor strip, wherein the first channel region is between the first source region and the drain region, wherein the drain region is disposed at a middle portion of the rectangular semiconductor strip, wherein the second channel region is between the drain region and the second source region, wherein the second source region is disposed at another end of the rectangular semiconductor strip, wherein the first source region is divided into a first part and a second part, wherein the first part is between the first channel region and the second part, wherein the second source region is divided into a third part and a fourth part, and wherein the third part is between the second channel region and the fourth part;

a first gate dielectric layer covering an outer surface of the first part of the first source region;

a second gate dielectric layer covering an outer surface of the third part of the second source region;

a first gate region comprising a first gate, a second gate, and a third gate that together surround a top end, a first side surface, and a second side surface of the first gate dielectric layer, wherein the first side surface and the second side surface are two outer surfaces of the first gate dielectric layer that are parallel and opposite to a plane formed by the first direction and a second direction parallel to a height direction of the rectangular semiconductor, and wherein a direction of an electric field applied in the first gate region points to the first source region; and a second gate region comprising a fourth gate, a fifth gate, and a sixth gate that together surround a top end, a third side surface, and a fourth side surface of the second gate dielectric layer, wherein the third side surface and the fourth side surface are two outer surfaces of the second gate dielectric layer that are parallel and opposite to the plane formed by the first direction and the second direction, wherein the third gate covers the top end of the first gate dielectric layer, wherein the first gate covers the first side surface of the first gate dielectric layer and a first outer surface of the third gate along the second direction, and wherein the second gate covers the second side surface of the first gate dielectric layer and a second outer surface of the third gate along the second direction.

12. The field-effect transistor of claim 11, wherein a direction of an electric field applied in the first gate region points to the first source region.

13. The field-effect transistor of claim 11, wherein a direction of an electric field applied in the second gate region points to the second source region.

14. The field-effect transistor of claim 11, wherein the first outer surface and the second outer surface are two outer surfaces of the third gate that are parallel and opposite to the plane formed by the first direction and the second direction, wherein the sixth gate covers the top end of the second gate dielectric layer, wherein the fourth gate covers the third side surface of the second gate dielectric layer and a third outer surface of the sixth gate, wherein the fifth gate covers the fourth side surface of the second gate dielectric layer and a fourth outer surface of the sixth gate along the second direction, and wherein the third outer surface and the fourth outer surface are two outer surfaces of the sixth gate that are parallel and opposite to the plane formed by the first direction and the second direction.

15. The field-effect transistor of claim 14, further comprising an epitaxial layer covering a region of the rectangular semiconductor strip, wherein the region of the rectangular semiconductor strip comprises a region from the first part to the third part of the rectangular semiconductor strip.

16. The field-effect transistor of claim 15, wherein the epitaxial layer comprises a first epitaxial layer, a second epitaxial layer, and a third epitaxial layer, wherein the first epitaxial layer covers the outer surface of the first part, wherein the first epitaxial layer is located between the first part and the first gate dielectric layer, wherein the second epitaxial layer covers the outer surface of the third part, wherein the second epitaxial layer is located between the third part and the second gate dielectric layer, wherein the third epitaxial layer covers an outer surface of the rectangular semiconductor strip between the first part and the third part, wherein the first epitaxial layer and the first part form a first tunneling junction, and wherein the second epitaxial layer and the third part form a second tunneling junction.

17. The field-effect transistor of claim 16, further comprising:
   a first isolating layer disposed between the first gate dielectric layer and the third gate; and
   a second isolating layer disposed between the second gate dielectric layer and the sixth gate.

\* \* \* \* \*